(12) United States Patent
Kohno et al.

(10) Patent No.: US 8,178,284 B2
(45) Date of Patent: May 15, 2012

(54) METHOD OF FORMING PATTERN

(75) Inventors: Shinichi Kohno, Kawasaki (JP); Hisanobu Harada, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 290 days.

(21) Appl. No.: 12/440,711

(22) PCT Filed: Sep. 21, 2007

(86) PCT No.: PCT/JP2007/068459
§ 371 (c)(1),
(2), (4) Date: Mar. 10, 2009

(87) PCT Pub. No.: WO2008/038602
PCT Pub. Date: Apr. 3, 2008

(65) Prior Publication Data
US 2009/0280438 A1      Nov. 12, 2009

(30) Foreign Application Priority Data

Sep. 29, 2006   (JP) .................................. 2006-267849

(51) Int. Cl.
*G03F 7/36*      (2006.01)
*G03F 7/22*      (2006.01)
*G03F 7/30*      (2006.01)
*G03F 7/039*     (2006.01)
*G03F 7/075*     (2006.01)

(52) U.S. Cl. ........ 430/311; 430/312; 430/313; 430/316; 430/317; 430/323; 430/326; 430/329

(58) Field of Classification Search .................. None
See application file for complete search history.

(56) References Cited

U.S. PATENT DOCUMENTS 5,945,517 A      8/1999  Nitta et al.
(Continued)

FOREIGN PATENT DOCUMENTS

JP      63-170917 A      7/1988
(Continued)

OTHER PUBLICATIONS

Ebihara, et al., Beyond k1=0.25 lithography: 70nm L/S patterning using KrF scanners, Proceedings of SPIE, Mar. 25, 2004 (received date), vol. 5256, p. 985 to 994.

(Continued)

*Primary Examiner* — Sin J. Lee

(74) *Attorney, Agent, or Firm* — Knobbe Martens Olson & Bear LLP

(57) ABSTRACT

A method of forming a pattern including: forming an underlayer film on a support using an underlayer film-forming material, forming a hard mask on the underlayer film using a silicon-based hard mask-forming material, forming a first resist film by applying a chemically amplified positive resist composition to the hard mask, forming a first resist pattern by selectively exposing the first resist film through a first mask pattern and then performing developing, forming a first pattern by etching the hard mask using the first resist pattern as a mask, forming a second resist film by applying a chemically amplified positive silicon-based resist composition to the first pattern and the underlayer film, forming a second resist pattern by selectively exposing the second resist film through a second mask pattern and then performing developing, and forming a second pattern by etching the underlayer film using the first pattern and the second resist pattern as a mask.

3 Claims, 2 Drawing Sheets

U.S. PATENT DOCUMENTS

| | | | |
|---|---|---|---|
| 6,015,650 A | 1/2000 | Bae | |
| 6,153,733 A | 11/2000 | Yukawa et al. | |
| 7,323,287 B2 | 1/2008 | Iwai et al. | |
| 2002/0058205 A1* | 5/2002 | Nakashima et al. | 430/285.1 |
| 2002/0059557 A1 | 5/2002 | Shin et al. | |
| 2004/0247900 A1 | 12/2004 | Ogihara et al. | |
| 2006/0014106 A1 | 1/2006 | Hatakeyama et al. | |
| 2007/0018286 A1 | 1/2007 | Chen | |
| 2008/0299494 A1* | 12/2008 | Bencher et al. | 430/313 |

FOREIGN PATENT DOCUMENTS

| | | |
|---|---|---|
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2002-175981 | 6/2002 |
| JP | 2002-220059 | 8/2002 |
| JP | 2003-241385 | 8/2003 |
| JP | 2004-046098 | 2/2004 |
| JP | 2004-296930 | 10/2004 |
| JP | 2005-18054 A | 1/2005 |
| JP | A-09-205081 | 1/2005 |
| JP | 2005-29742 A | 2/2005 |
| JP | 2005-043852 | 2/2005 |
| JP | A-2005-159264 | 6/2005 |
| JP | 2006-84799 | 3/2006 |
| JP | A-2007-027742 | 2/2007 |
| TW | 200608144 A | 3/2006 |
| WO | WO 2004-074242 | 9/2004 |
| WO | WO 2005/007747 | 1/2005 |
| WO | WO 2006/030641 | 3/2006 |
| WO | WO 2006/065321 | 6/2006 |
| WO | WO 2008/041468 A1 * | 4/2008 |

OTHER PUBLICATIONS

Lee et al., Double exposure technology using silicon containing materials, Proceedings of SPIE, Jul. 24, 2006 (received date), vol. 6153, 61531K1-7.

International Search Report issued for corresponding PCT Application No. PCT/JP2007/068459, dated Oct. 23, 2007.

Office Action issued for Taiwanese Application No. 096134909, (2011).

Office Action issued in Japanese Patent Application No. 2006-267849 on Jan. 4, 2012.

* cited by examiner

METHOD OF FORMING PATTERN

RELATED APPLICATIONS

This application is the U.S. National Phase filing under 35 U.S.C. §371 of PCT/JP2007/068459, filed Sep. 21 2007, which designated the United States and was published in a language other than English, which claims priority under 35 U.S.C. §119(a)-(d) to Japanese Patent Application No. 2006-267849, filed Sep. 29, 2006. The contents of these applications are incorporated herein by reference in their entireties.

TECHNICAL FIELD

The present invention relates to a method of forming a pattern in which a chemically amplified resist composition is used to form a pattern using a double patterning method.

BACKGROUND ART

Techniques (pattern-forming techniques) in which a fine pattern is formed on top of a substrate, and a lower layer beneath that pattern is then processed by conducting etching with the pattern as a mask are widely used in the semiconductor industry for IC fabrication and the like, and are attracting considerable attention.

These fine patterns are typically formed from an organic material, and are formed, for example, using a lithography method or a nanoimprint method or the like. For example, in the case of a lithography method, a process is conducted in which a resist film formed from a resist composition containing a base component such as a resin is formed on top of a support such as a substrate, the resist film is subjected to selective exposure using radiation such as light or an electron beam, through a mask in which a predetermined pattern has been formed (a mask pattern), and a developing treatment is then conducted, thereby forming a resist pattern of predetermined shape in the resist film. Resist compositions in which the exposed portions change to become soluble in the developing solution are termed positive compositions, whereas resist compositions in which the exposed portions change to become insoluble in the developing solution are termed negative compositions.

Then, using this resist pattern as a mask, a semiconductor device or the like is produced by conducting a step in which the substrate is processed by etching.

In recent years, advances in lithography techniques have lead to rapid progress in the field of pattern miniaturization. Typically, these miniaturization techniques involve shortening the wavelength of the exposure light source. Conventionally, ultraviolet radiation typified by g-line and i-line radiation has been used, but nowadays semiconductor device mass production using KrF excimer lasers and ArF excimer lasers has already commenced, and for example, lithography using ArF excimer lasers has enabled pattern formation with resolution at the 45 nm level. Furthermore, in order to further improve the resolution, research is also being conducted into lithography techniques that use exposure light sources having a wavelength shorter than these excimer lasers, such as $F_2$ excimer lasers, electron beams, EUV (extreme ultra violet radiation), and X rays.

The resist composition requires lithography properties such as a high level of sensitivity to these types of exposure sources, and a high resolution capable of reproducing patterns of minute dimensions. An example of a resist material that satisfies these requirements is a chemically amplified resist composition, which includes a base component that exhibits changed alkali solubility under the action of acid and an acid generator that generates acid upon exposure (for example, see Patent Document 1). For example, a positive chemically amplified resist typically contains, as a base component, a resin that exhibits increased alkali solubility under the action of acid, and during formation of a resist pattern, when acid is generated from the acid generator by exposure, the exposed portions of the resist become alkali-soluble.

Recently, a new lithography technique called the double patterning method has been proposed, in which a pattern is formed by conducting patterning two or more times (see, for example, Non-Patent Documents 1 and 2). It is considered that by using this double patterning method, a pattern can be formed that is finer than a pattern formed using only a single patterning step.

[Patent Document 1]

Japanese Unexamined Patent Application, First Publication No. 2003-241385

[Non-Patent Document 1]

Proceedings of SPIE, vol. 5256, pp. 985 to 994 (2003)

[Non-Patent Document 2]

Proceedings of SPIE, vol. 6153, pp. 1 to 7 (2006)

DISCLOSURE OF INVENTION

Problems to be Solved by the Invention

However, actual patterns formed on substrates using conventional double patterning methods such as the methods proposed in Non-Patent Documents 1 and 2 tend to also incorporate some pattern collapse and/or regions in which the pattern shape exhibits poor verticalness, and certain issues still remain in terms of the formation of very fine patterns having a high aspect ratio.

The present invention takes the above circumstances into consideration, and has an object of providing a method of forming a pattern that enables a very fine pattern having a high aspect ratio to be formed on a support.

Means to Solve the Problems

In order to achieve the above object, the present invention adopts the aspect described below.

Namely, the present invention provides a method of forming a pattern using a chemically amplified resist composition, the method including: forming an underlayer film on a support using an underlayer film-forming material, forming a hard mask on the underlayer film using a silicon-based hard mask-forming material, forming a first resist film by applying a chemically amplified positive resist composition to the hard mask, forming a first resist pattern by selectively exposing the first resist film through a first mask pattern and then performing developing, forming a first pattern by etching the hard mask using the first resist pattern as a mask, forming a second resist film by applying a chemically amplified positive silicon-based resist composition to the first pattern and the underlayer film, forming a second resist pattern by selectively exposing the second resist film through a second mask pattern and then performing developing, and forming a second pattern by etching the underlayer film using the first pattern and the second resist pattern as a mask.

EFFECT OF THE INVENTION

According to the present invention, a very fine pattern having a high aspect ratio can be formed on a support.

DESCRIPTION OF THE REFERENCE SYMBOLS

Figure 1A:
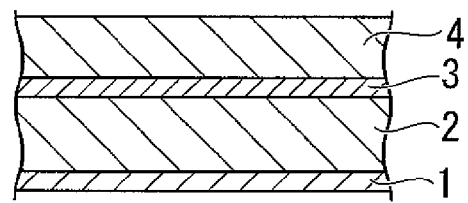
FIG. 1A is a schematic process diagram illustrating a patterning process (1) of a preferred embodiment of a method of forming a pattern according to the present invention.

| | |
|---|---|
| 1 | Support |
| 2 | Underlayer film |
| 2' | Underlayer film pattern |
| 3 | Hard mask |
| 3' | Hard mask pattern |
| 4 | First resist film |
| 4' | First resist pattern |
| 5 | First mask pattern |
| 6 | Second resist film |
| 6' | Second resist pattern |
| 7 | Second mask pattern |

BEST MODE FOR CARRYING OUT THE INVENTION

First is a description of the materials used in the present invention.

<<Chemically Amplified Positive Silicon-based Resist Composition>>

In the present invention, there are no particular limitations on the chemically amplified positive silicon-based resist composition, and usually, a composition containing a component that exhibits increased alkali solubility under the action of acid and an acid generator component that generates acid upon exposure is used. Further, a composition that exhibits resistance to the type of oxygen plasma etching typically used during pattern formation on the underlayer film described below is preferred.

Of the various possibilities, an example of a preferred composition is a resist composition including a resin component (A) that exhibits increased alkali solubility under the action of acid (hereafter frequently referred to as "component (A)") and an acid generator component (B) that generates acid upon exposure (hereafter frequently referred to as "component (B)"), wherein the resin component (A) includes a resin (A1) containing a structural unit (a1) represented by general formula (a1) shown below and a structural unit (a2) represented by general formula (a2) shown below.

[Chemical Formula 1]

In formula (a2), $R^1$ is an acid-decomposable group represented by general formula (I) shown below.

[Chemical Formula 2]

wherein $R^2$ and $R^3$ each independently represents a linking group; L represents a group selected from the group consisting of linear or branched alkylene groups of 1 to 10 carbon atoms, linear or branched fluoroalkylene groups of 2 to 20 carbon atoms, substituted or unsubstituted arylene groups, substituted or unsubstituted cyclic alkylene groups, and substituted or unsubstituted alkarylene groups; Z represents an acid-dissociable group; g represents 0 or 1; and h represents 0 or 1.

This resist composition is alkali-insoluble prior to exposure, but when acid is generated from the component (B) upon exposure, this acid acts upon the component (A) and increases the alkali solubility of the component (A). Accordingly, during the formation of a resist pattern, by selectively exposing a resist film obtained by using the resist composition, the exposed portions become alkali-soluble, whereas the unexposed portions remain alkali-insoluble, meaning alkali developing can then be conducted to form a resist pattern.

<Component (A)>

[Resin (A1)]

The structural unit (a1) contributes to an improvement in the transparency of the resin (A1), and particularly to an improvement in the transparency relative to light having a wavelength of 200 nm or less, thereby improving the sensitivity and the resolution and the like of the resist composition.

In the resin (A1), the proportion of the structural unit (a1), relative to the combined total of all the structural units that constitute the resin (A1), is preferably within a range from 20 to 90 mol %, more preferably from 30 to 80 mol %, and still more preferably from 40 to 60 mol %. Provided the proportion of the structural unit (a1) proportion is at least 20 mol %, the transparency of the resin relative to light having a wavelength of 200 nm or less is improved. Further, provided the proportion of the structural unit (a1) is not more than 90 mol %, a favorable balance can be achieved with the other structural units such as structural unit (a2).

The structural unit (a2) has an acid-decomposable group $R^1$ represented by general formula (I) shown above. When acid is generated from the component (B) upon exposure, the bond in the group $R^1$ between Z and the atom bonded thereto is broken, decomposing the group into Z and a remaining portion.

In formula (I), $R^2$ and $R^3$ each independently represents a linking group. There are no particular limitations on these linking groups, although a linear or branched alkylene group of 1 to 5 carbon atoms is preferable, and a methylene group or ethylene group is more preferable.

L represents a linear or branched alkylene group, a linear or branched fluoroalkylene group, an arylene group, a cyclic alkylene group or an alkarylene group.

The linear or branched alkylene group for L is preferably a linear or branched alkylene group of 1 to 10 carbon atoms, and more preferably 1 to 5 carbon atoms, and is most preferably a methylene group or ethylene group.

The linear or branched fluoroalkylene group of 2 to 20 carbon atoms for L is a group in which some or all of the hydrogen atoms of a linear or branched alkylene group of 2 to 20 carbon atoms have been substituted with fluorine atoms.

The arylene group for L may be either an unsubstituted arylene group, or a substituted arylene group in which some or all of the hydrogen atoms bonded to the carbon atoms that constitute the ring of an aforementioned unsubstituted arylene group have been substituted with substituents. Examples of unsubstituted arylene groups include groups in which two hydrogen atoms have been removed from benzene, naphthalene or anthracene or the like. The number of carbon atoms within this type of unsubstituted arylene group is preferably within a range from 6 to 14. Examples of the substituents within the substituted arylene groups include alkyl groups, alkoxy groups and aryl groups. The number of carbon atoms within these substituents is preferably within a range from 1 to 10.

The cyclic alkylene group for L may be either an unsubstituted cyclic alkylene group, or a substituted alkylene group in which some or all of the hydrogen atoms bonded to the carbon atoms that constitute the ring of an aforementioned cyclic alkylene group have been substituted with substituents. The unsubstituted cyclic alkylene group is preferably a cyclic alkylene group of 4 to 12 carbon atoms, and examples thereof include groups in which two carbon atoms have been removed from a monocycloalkane such as cyclopentane or cyclohexane, and groups in which two carbon atoms have been removed from a polycycloalkane such as adamantane, norbornane, norbornene, methylnorbornane, ethylnorbornane, methylnorbornene, ethylnorbornene, isobornane, tricyclodecane or tetracyclododecane. Examples of the substituents within the substituted cyclic alkylene groups include the same groups as those exemplified above as substituents for the substituted arylene groups.

The alkarylene group for L is a group in which two alkylene groups are bonded to an aromatic ring such as benzene, naphthalene or anthracene. The number of carbon atoms within the aromatic ring is preferably within a range from 6 to 14. Examples of the alkylene groups include the same groups as those exemplified above for the alkylene groups for $R^2$ and $R^3$, and these two alkylene groups may be either the same or different. Examples of unsubstituted alkarylene groups include groups represented by formula (AL-1) shown below. Examples of substituted alkarylene groups include groups in which some or all of the hydrogen atoms bonded to the carbon atoms that constitute the ring of an aforementioned unsubstituted alkarylene group have been substituted with substituents. Examples of the substituents include the same groups as those exemplified above as substituents for the substituted arylene groups.

[Chemical Formula 3]

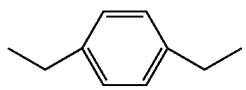

(AL-1)

As the group L, a methylene group, ethylene group, cyclic alkylene group or alkarylene group is preferred, an unsubstituted cyclic alkylene group is more preferred, and a group in which two hydrogen atoms have been removed from norbornane (namely, a norbornene group) is particularly desirable.

Z is an acid-dissociable group.

In the present invention, the term "acid-dissociable group" describes a group that dissociates under the action of the acid generated from the component (B) upon exposure.

In a resist composition that includes a resin (A1) containing a structural unit (a2) having an acid-dissociable group and a component (B), the acid generated from the component (B) upon exposure causes the group Z to dissociate. As a result, the alkali solubility of the resin (A1) increases.

There are no particular limitations on the acid-dissociable group represented by Z, provided the group is able to dissociate from the main polymer chain of the resin (A1) under the action of the acid generated from the component (B). For example, the types of groups proposed as acid-dissociable, dissolution-inhibiting groups for the base components of conventional positive resist compositions can be used.

Here, the term "acid-dissociable, dissolution-inhibiting group" describes an acid-dissociable group that has an alkali dissolution inhibiting effect that renders the entire compound alkali-insoluble prior to dissociation, but then causes the entire compound to change to an alkali-soluble state following dissociation.

Specific examples of the acid-dissociable group are not particularly limited, and examples include groups represented by a general formula —$COOR^7$, groups represented by a general formula —$OCOOR^8$, and groups represented by a general formula —$OR^9$.

In the above formulas, $R^7$ to $R^9$ are organic groups that have the function of imparting the group represented by —$COOR^7$, the group represented by —$OCOOR^8$, and the group represented by —$OR^9$ respectively with acid dissociability. Here, the term "organic group" describes a group having at least a carbon atom and one or more other types of atom.

Examples of $R^7$ include chain-like tertiary alkyl groups, aliphatic cyclic groups containing a tertiary carbon atom within the ring structure, and 2-trialkylethyl groups.

The chain-like tertiary alkyl group preferably contains 4 to 10 carbon atoms, and more preferably 4 to 8 carbon atoms. Specific examples of chain-like tertiary alkyl groups include a tert-butyl group and a tert-amyl group.

In the present invention, the term "aliphatic cyclic group" describes a monocyclic group or polycyclic group that has no aromaticity. The aliphatic cyclic group containing a tertiary carbon atom within the ring structure preferably contains 4 to 14 carbon atoms, and more preferably 5 to 10 carbon atoms. Specific examples of the aliphatic cyclic group include an adamantyl group, norbornyl group, isobornyl group, 2-methyl-2-adamantyl group, 2-ethyl-2-adamantyl group, 2-methyl-2-isobornyl group, 2-butyl-2-adamantyl group, 2-propyl-2-isobornyl group, 2-methyl-2-tetracyclodecenyl group, 2-methyl-2-dihydrodicyclopentadienyl-cyclohexyl group, 1-methyl-1-cyclopentyl group, 1-ethyl-1-cyclopentyl group, 1-methyl-1-cyclohexyl group and 1-ethyl-1-cyclohexyl group.

Examples of the 2-trialkylethyl group include a 2-trimethylsilylethyl group and a 2-triethylsilylethyl group.

Examples of $R^8$ include the same groups as those exemplified above for $R^7$.

Examples of $R^9$ include a tetrahydropyranyl group, 1-adamantoxymethyl group, 1-cyclohexyloxymethyl group and trialkylsilyl groups. Specific examples of the trialkylsilyl groups include a trimethylsilyl group.

Of the above groups, Z is preferably a group represented by the general formula —$COOR^7$, and of these groups, those in which $R^7$ represents a chain-like tertiary alkyl group are particularly preferred. The group in which $R^7$ is a tert-butyl group, namely a tert-butoxycarbonyl group, is the most desirable.

g may be either 0 or 1, but is preferably 0.

h may be either 0 or 1, but is preferably 0.

In the present invention, $R^1$ is preferably a group represented by general formula (I-1) shown below.

[Chemical Formula 4]

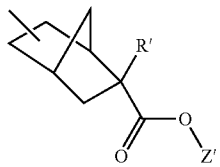

(I-1)

wherein R' represents a hydrogen atom or an alkyl group of 1 to 5 carbon atoms, and Z' represents a chain-like tertiary alkyl group.

As the structural unit (a2), one type of unit may be used alone, or two or more types may be used in combination.

In the resin (A1), the proportion of the structural unit (a2), relative to the combined total of all the structural units that constitute the resin (A1), is preferably within a range from 10 to 80 mol %, more preferably from 20 to 60 mol %, and still more preferably from 30 to 50 mol %. Provided the proportion of the structural unit (a2) proportion is at least 10 mol %, a pattern can be obtained when the resin is used within a resist composition. On the other hand, provided the proportion of the structural unit (a2) is not more than the upper limit of the above-mentioned range, a favorable balance can be achieved with the other structural units.

Furthermore, in the present invention, in the resin (A1), the combined proportion of the structural units (a1) and (a2), relative to the combined total of all the structural units that constitute the resin (A1), is preferably at least 50 mol %, more preferably 70 mol % or higher, and may be 100 mol %.

The resin (A1) may also contain other structural units besides the above-mentioned structural units (a1) and (a2), provided the effects of the present invention are not impaired.

As this other structural unit besides the structural units (a1) and (a2), a structural unit (a3) represented by formula (a3) shown below may be exemplified.

[Chemical Formula 5]

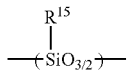

(a3)

In formula (a3), $R^{15}$ represents an alkyl group of 1 to 20 carbon atoms or an aryl group.

The alkyl group for $R^{15}$ may be a linear, branched or cyclic group, and is preferably a linear or branched alkyl group of 1 to 6 carbon atoms or a cyclic alkyl group of 5 to 12 carbon atoms. Specific examples include a methyl group, ethyl group, n-propyl group, isopropyl group, n-butyl group, tert-butyl group, cyclopentyl group and cyclohexyl group.

Examples of the aryl group for $R^{15}$ include a phenyl group and a naphthyl group. These aryl groups may also include alkyl groups or the like as substituents.

Production of the resin (A1) can be conducted using a conventional method of producing a hydrogenated silsesquioxane resin. In one example of such a method, a trihalogenated silane such as trichlorosilane ($HSiCl_3$) is first subjected to a dehydration-condensation to synthesize a hydrogenated silsesquioxane resin containing the structural unit (a1) (hereafter referred to as "the precursor resin"). The precursor resin produced in this manner includes the structural unit (a1). Further, in this synthesis method, besides the structural unit (a1), other structural units such as $(Si(OH)O_{3/2})$, $(HSi(OH)O_{2/2})$ and $(SiO_{4/2})$ are often generated as by-products during the reaction. Moreover, the precursor resin synthesized in this manner typically includes polymers having a variety of different network-type structures, including ladder, random and cage structures.

Subsequently, $R^1$ groups are introduced into the precursor resin by substituting some of the hydrogen atoms within the precursor resin (such as the hydrogen atom within the structural unit (a1)) with $R^1$ groups. This process converts some of the structural units (a1) into structural units (a2), yielding a resin (A1) containing the structural unit (a1) and the structural unit (a2). Furthermore, in those cases where the precursor resin includes other structural units such as $(Si(OH)O_{3/2})$ and/or $(HSi(OH)O_{2/2})$, structural units generated by substituting the hydrogen atoms within these other structural units with $R^1$ groups may also be formed.

The $R^1$ groups can be introduced, for example, by conducting a hydrosilylation reaction, in the presence of a catalyst, between the precursor resin and a compound corresponding with the $R^1$ group that is to be introduced (for example, bicyclo[2,2,1]hept-5-ene-2-tert-butylcarboxylate).

Further, at this point, by adjusting the quantity used of the compound corresponding with the $R^1$ group that is to be introduced, and adjusting the reaction conditions and the like, the proportions of the structural units (a1) and (a2) and the like within the resin (A1) can be controlled.

In the resin (A1), the ratio of structural unit (a1):structural unit (a2) is preferably within a range from 90:10 to 10:90 (molar ratio), more preferably from 80:20 to 30:70, still more preferably from 70:30 to 35:65, and is most preferably from 65:35 to 40:60.

Although there are no particular limitations on the weight average molecular weight (Mw) of the resin (A1) (namely, the polystyrene equivalent weight average molecular weight determined by gel permeation chromatography (hereafter frequently abbreviated as "GPC"), this also applies below), Mw is preferably within a range from 1,500 to 20,000, and more preferably from 6,000 to 6,500. Provided Mw is not higher than the upper limit of the above range, the solubility of the resin in organic solvents is favorable, whereas provided Mw is not lower than the lower limit, the shape of the formed resist pattern can be improved.

Further, although there are no particular limitations on the value of Mw/Mn, a value within a range from 1.0 to 6.0 is preferable, and a value of 1.0 to 2.5 is more preferable.

As the resin (A1), one type of resin may be used alone, or two or more types may be used in combination.

The proportion of the resin (A1) within the component (A), relative to the total weight of the component (A), is preferably at least 50% by weight, more preferably 70% by weight or higher, and may be 100% by weight, as such a proportion yields a superior effect for the present invention, namely superior formation of a very fine pattern having a high aspect ratio on a support.

In the present invention, the component (A) may also include a resin component (A2) (hereafter referred to as "component (A2)") other than the resin (A1), provided the effects of the present invention are not impaired. There are no particular limitations on this component (A2), which may be selected in accordance with the radiation source used during resist pattern formation, from the multitude of resins that have been proposed as base resins for conventional chemically amplified resist compositions.

<Component (B)>

As the component (B), there are no particular limitations, and any of the known acid generators proposed for use in conventional chemically amplified resists can be used.

Examples of these acid generators are numerous, and include onium salt-based acid generators such as iodonium salts and sulfonium salts, oxime sulfonate-based acid generators, diazomethane-based acid generators such as bisalkyl or bisaryl sulfonyl diazomethanes and poly(bis-sulfonyl)diazomethanes, nitrobenzyl sulfonate-based acid generators, iminosulfonate-based acid generators, and disulfone-based acid generators.

Examples of onium salt-based acid generators include compounds represented by general formula (b-0) shown below.

[Chemical Formula 6]

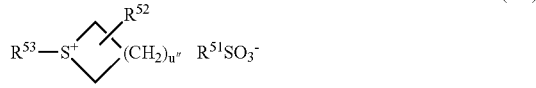

(b-0)

wherein $R^{51}$ represents a linear, branched or cyclic alkyl group, or a linear, branched or cyclic fluorinated alkyl group; $R^{52}$ represents a hydrogen atom, a hydroxyl group, a halogen atom, a linear or branched alkyl group, a linear or branched halogenated alkyl group, or a linear or branched alkoxy group; $R^{53}$ represents an aryl group which may have a substituent; and u" represents an integer of 1 to 3.

In general formula (b-0), $R^{51}$ represents a linear, branched or cyclic alkyl group, or a linear, branched or cyclic fluorinated alkyl group.

The linear or branched alkyl group preferably has 1 to 10 carbon atoms, more preferably 1 to 8 carbon atoms, and most preferably 1 to 4 carbon atoms.

The cyclic alkyl group preferably has 4 to 12 carbon atoms, more preferably 5 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms. The fluorination ratio of the fluorinated alkyl group (the percentage of the number of substituent fluorine atoms relative to the total number of hydrogen atoms within the unsubstituted alkyl group) is preferably from 10 to 100%, more preferably from 50 to 100%, and it is particularly desirable that all of the hydrogen atoms are substituted with fluorine atoms, as the acid strength increases.

$R^{51}$ is most preferably a linear alkyl group or a fluorinated alkyl group.

$R^{52}$ represents a hydrogen atom, a hydroxyl group, a halogen atom, a linear or branched alkyl group, a linear or branched halogenated alkyl group, or a linear or branched alkoxy group.

Examples of the halogen atom for $R^{52}$ include a fluorine atom, a bromine atom, a chlorine atom and an iodine atom, and a fluorine atom is preferable.

The alkyl group for $R^{52}$ is linear or branched, and preferably has 1 to 5 carbon atoms, more preferably 1 to 4 carbon atoms, and most preferably 1 to 3 carbon atoms.

The halogenated alkyl group for $R^{52}$ is a group in which some or all of the hydrogen atoms of the alkyl group have been substituted with halogen atoms. As the alkyl group of the halogenated alkyl group, the same groups as the alkyl group for $R^{52}$ may be exemplified. As the halogen atoms for substituting the hydrogen atoms of the alkyl group, the same as the halogen atom for $R^{52}$ may be exemplified. In the halogenated alkyl group, it is preferable that 50 to 100% of the hydrogen atoms of the alkyl group are substituted with halogen atoms, and it is more preferable that all of the hydrogen atoms are substituted with halogen atoms.

The alkoxy group for $R^{52}$ is linear or branched, and preferably has 1 to 5 carbon atoms, more preferably 1 to 4 carbon atoms, and most preferably 1 to 3 carbon atoms.

Among these, as $R^{52}$, a hydrogen atom is particularly desirable.

$R^{53}$ represents an aryl group which may have a substituent, and examples of the basic ring excluding the substituent include a naphthyl group, a phenyl group and an anthracenyl group. In terms of the effects of the present invention and absorption of the exposure radiation such as an ArF excimer laser, a phenyl group is preferable.

Examples of the substituent include a hydroxyl group and a lower alkyl group (which may be linear or branched and preferably has no more than 5 carbon atoms, with a methyl group being particularly desirable). In this description and the claims, the term "lower" refers to a number of carbon atoms within a range from 1 to 5.

As the aryl group for $R^{53}$, groups that do not have a substituent are preferable.

u" is an integer of 1 to 3, is preferably 2 or 3, and it is particularly desirable that u" be 3.

As preferred examples of acid generators represented by general formula (b-0), the following can be exemplified.

[Chemical Formula 7]

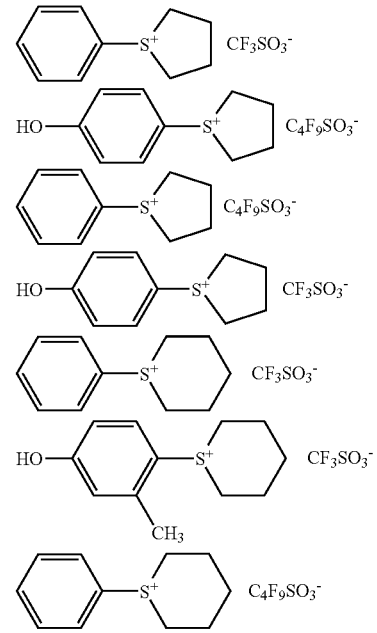

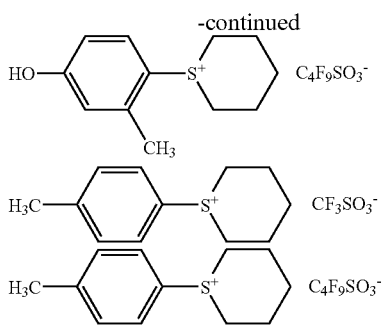

Examples of onium salt-based acid generators other than those described above include compounds represented by general formula (b-1) or (b-2) shown below.

[Chemical Formula 8]

wherein $R^{1\prime\prime}$ to $R^{3\prime\prime}$, $R^{5\prime\prime}$ and $R^{6\prime\prime}$ each independently represents an aryl group or an alkyl group; and $R^{4\prime\prime}$ represents a linear, branched or cyclic alkyl group or fluorinated alkyl group, with the proviso that at least one of $R^{1\prime\prime}$ to $R^{3\prime\prime}$ represents an aryl group, and at least one of $R^{5\prime\prime}$ and $R^{6\prime\prime}$ represents an aryl group.

In formula (b-1), $R^{1\prime\prime}$ to $R^{3\prime\prime}$ each independently represents an aryl group or an alkyl group. Further, among $R^{1\prime\prime}$ to $R^{3\prime\prime}$, at least one group represents an aryl group. Among $R^{1\prime\prime}$ to $R^{3\prime\prime}$, two or more groups are preferably aryl groups, and it is particularly desirable that all of $R^{1\prime\prime}$ to $R^{3\prime\prime}$ are aryl groups.

The aryl group for $R^{1\prime\prime}$ to $R^{3\prime\prime}$ is not particularly limited. For example, an aryl group having 6 to 20 carbon atoms may be used in which some or all of the hydrogen atoms of the aryl group may or may not be substituted with alkyl groups, alkoxy groups, halogen atoms or the like. The aryl group is preferably an aryl group having 6 to 10 carbon atoms because it can be synthesized at a low cost. Specific examples thereof include a phenyl group and a naphthyl group.

The alkyl group with which hydrogen atoms of the aryl group may be substituted is preferably an alkyl group having 1 to 5 carbon atoms, and is most preferably a methyl group, an ethyl group, a propyl group, an n-butyl group or a tert-butyl group.

The alkoxy group with which hydrogen atoms of the aryl group may be substituted is preferably an alkoxy group having 1 to 5 carbon atoms, and is most preferably a methoxy group or ethoxy group.

The halogen atom with which hydrogen atoms of the aryl group may be substituted is preferably a fluorine atom.

The alkyl group for $R^{1\prime\prime}$ to $R^{3\prime\prime}$ is not particularly limited and includes, for example, linear, branched or cyclic alkyl groups having 1 to 10 carbon atoms. In terms of achieving excellent resolution, the alkyl group preferably has 1 to 5 carbon atoms. Specific examples thereof include a methyl group, ethyl group, n-propyl group, isopropyl group, n-butyl group, isobutyl group, n-pentyl group, cyclopentyl group, hexyl group, cyclohexyl group, nonyl group and decanyl group, and a methyl group is most preferable as it yields excellent resolution and can be synthesized at a low cost.

It is particularly desirable that each of $R^{1\prime\prime}$ to $R^{3\prime\prime}$ is a phenyl group or a naphthyl group.

$R^{4\prime\prime}$ represents a linear, branched or cyclic alkyl group or fluorinated alkyl group.

The linear alkyl group preferably has 1 to 10 carbon atoms, more preferably 1 to 8 carbon atoms, and most preferably 1 to 4 carbon atoms. The cyclic alkyl group is preferably a cyclic group as described for $R^{1\prime\prime}$, having 4 to 15 carbon atoms, more preferably 4 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms. Further, the fluorination ratio of the fluorinated alkyl group (the percentage of fluorine atoms within the alkyl group) is preferably from 10 to 100%, more preferably from 50 to 100%, and it is particularly desirable that all hydrogen atoms are substituted with fluorine atoms because the acid strength increases.

$R^{4\prime\prime}$ is most preferably a linear or cyclic alkyl group or a fluorinated alkyl group.

In formula (b-2), $R^{5\prime\prime}$ and $R^{6\prime\prime}$ each independently represents an aryl group or alkyl group. At least one of $R^{5\prime\prime}$ and $R^{6\prime\prime}$ represents an aryl group. It is preferable that both $R^{5\prime\prime}$ and $R^{6\prime\prime}$ represent aryl groups.

As the aryl group for $R^{5\prime\prime}$ and $R^{6\prime\prime}$, the same groups as the aryl groups for $R^{1\prime\prime}$ to $R^{3\prime\prime}$ can be exemplified.

As the alkyl group for $R^{5\prime\prime}$ and $R^{6\prime\prime}$, the same groups as the alkyl groups for $R^{1\prime\prime}$ to $R^{3\prime\prime}$ can be exemplified.

It is particularly desirable that both $R^{5\prime\prime}$ and $R^{6\prime\prime}$ represent phenyl groups.

As $R^{4\prime\prime}$ in formula (b-2), the same groups as those mentioned above for $R^{4\prime\prime}$ in formula (b-1) can be exemplified.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; and di(1-naphthyl)phenylsulfonium trifluoromethanesulfonate, heptafluoropropanesulfonate or nonafluorobutanesulfonate. It is also possible to use onium salts in which the anion moiety of these onium salts is replaced by methanesulfonate, n-propanesulfonate, n-butanesulfonate, or n-octanesulfonate.

Further, onium salt-based acid generators in which the anion moiety in general formula (b-1) or (b-2) is replaced by an anion moiety represented by general formula (b-3) or (b-4) shown below (and in which the cation moiety is the same as (b-1) or (b-2)) may also be used.

[Chemical Formula 9]

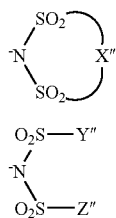

(b-3)

(b-4)

wherein X" represents an alkylene group of 2 to 6 carbon atoms in which at least one hydrogen atom has been substituted with a fluorine atom, and Y" and Z" each independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, wherein the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, wherein the alkyl group has 1 to 10 carbon atoms, preferably 1 to 7 carbon atoms, and most preferably 1 to 3 carbon atoms.

The number of carbon atoms within the above-mentioned ranges for the alkylene group for X" or the alkyl group for Y" and Z" is preferably as small as possible, as a smaller number of carbon atoms results in improved solubility in the resist solvent.

Further, in the alkylene group for X" or the alkyl group for Y" and Z", it is preferable that the number of hydrogen atoms substituted with fluorine atoms is as large as possible, because the acid strength increases and the transparency to high energy radiation of 200 nm or less or an electron beam is improved. The proportion of fluorine atoms within the alkylene group or alkyl group, namely the fluorination ratio, is preferably from 70 to 100% and more preferably from 90 to 100%, and it is particularly desirable that the alkylene group or alkyl group is a perfluoroalkylene or perfluoroalkyl group in which all the hydrogen atoms have been substituted with fluorine atoms.

Furthermore, onium salt-based acid generators having an anion moiety represented by general formula (b-5) shown below (hereafter frequently referred to as "component (b-5)") are also preferred.

In recent years, as the miniaturization of resist patterns has continued to progress, not only is higher resolution being required, but improvements in a variety of other lithography properties are also being demanded. Among such demands, in order to improve the process margin during pattern formation, improvements in the exposure margin (EL margin) are required.

The EL margin is the exposure dose range over which a resist pattern can be formed with a size that falls within a predetermined range of variation from a target size, when exposure is conducted while varying the exposure dose, namely, the exposure dose range over which a resist pattern faithful to the mask can be formed. A larger EL margin is preferable.

In the present invention, by using an onium salt-based acid generator having an anion moiety represented by general formula (b-5) shown below, the EL margin can be improved without causing any deterioration in the resist pattern shape.

[Chemical Formula 10]

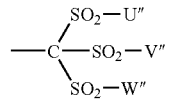

(b-5)

wherein U", V" and W" each independently represents an alkyl group of 1 to 10 carbon atoms in which at least one hydrogen atom has been substituted with a fluorine atom.

In formula (b-5), U", V" and W" each independently represents an alkyl group of 1 to 10 carbon atoms in which at least one hydrogen atom has been substituted with a fluorine atom. The alkyl group is preferably a linear or branched group. The number of carbon atoms within the alkyl group is preferably from 1 to 7, and more preferably from 1 to 3.

The number of carbon atoms within the above-mentioned range for the alkyl group for U", V" and W" is preferably as small as possible, as a smaller number of carbon atoms results in improved solubility in the resist solvent.

Further, in the alkyl group for U", V" and W", it is preferable that the number of hydrogen atoms substituted with fluorine atoms is as large as possible, because the acid strength increases and the transparency to high energy radiation of 200 nm or less or an electron beam is also improved.

The proportion of fluorine atoms within the alkyl group, namely the fluorination ratio, is preferably from 70 to 100% and more preferably from 90 to 100%, and is most preferably 100%. In other words, as the alkyl group for U", V" and W", a perfluoroalkyl group in which all the hydrogen atoms have been substituted with fluorine atoms is the most preferable.

There are no particular limitations on the cation moiety for the component (b-5), and the same cation moieties as those used within conventional acid generators can be used.

As the cation moiety for the component (b-5), a cation moiety of an onium salt-based acid generator represented by general formula (b-1) or (b-2) shown above, namely a cation moiety represented by general formula (b'-1) or (b'-2) shown below is preferred.

[Chemical Formula 11]

(b'-1)

$$R^{2''}-\overset{R^{1''}}{\underset{R^{3''}}{\overset{|}{S^+}}}$$

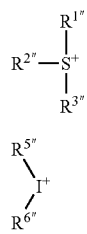

(b'-2)

In formula (b'-1), $R^{1''}$ to $R^{3''}$ each independently represents an aryl group or an alkyl group, with the proviso that at least one of $R^{1''}$ to $R^{3''}$ represents an aryl group. In formula (b'-2), $R^{5''}$ and $R^{6''}$ each independently represents an aryl group or an alkyl group, with the proviso that at least one of $R^{5''}$ and $R^{6''}$ represents an aryl group.

$R^{1\prime\prime\prime}$ to $R^{3\prime\prime\prime}$ in formula (b'-1) and $R^{5\prime\prime\prime}$ to $R^{6\prime\prime\prime}$ in formula (b'-2) are as defined for $R^{1\prime\prime\prime}$ to $R^{3\prime\prime\prime}$ in formula (b-1) and $R^{5\prime\prime\prime}$ to $R^{6\prime\prime\prime}$ in formula (b-2).

Specific examples of the cation moiety represented by formula (b'-1) or (b'-2) include a diphenyliodonium ion, bis(4-tert-butylphenyl)iodonium ion, triphenylsulfonium ion, tri(4-methylphenyl)sulfonium ion, dimethyl(4-hydroxynaphthyl)sulfonium ion, monophenyldimethylsulfonium ion, diphenylmonomethylsulfonium ion, (4-methylphenyl)diphenylsulfonium ion, (4-methoxyphenyl)diphenylsulfonium ion, tri(4-tert-butyl)phenylsulfonium ion, diphenyl(1-(4-methoxy)naphthyl)sulfonium ion, diphenylmononaphthylsulfonium ion, and di(1-naphthyl)monophenylsulfonium ion.

As the component (b-5), onium salts represented by general formula (b-5-1) shown below are preferred.

[Chemical Formula 12]

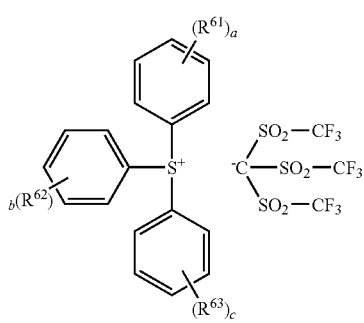

(b-5-1)

wherein $R^{61}$ to $R^{63}$ each independently represents an alkyl group, and a, b and c each represents an integer of 0 to 2.

In formula (b-5-1), $R^{61}$ to $R^{63}$ each independently represents an alkyl group, and examples of these alkyl groups include the same alkyl groups as those exemplified above for the alkyl group with which hydrogen atoms of the aryl group of $R^{1\prime\prime\prime}$ to $R^{3\prime\prime\prime}$ may be substituted. A methyl group and/or tert-butyl group is preferred, and a tert-butyl group is particularly desirable.

a represents an integer of 0 to 2, is preferably 0 or 1, and is most preferably 1.

b represents an integer of 0 to 2, is preferably 0 or 1, and is most preferably 1.

c represents an integer of 0 to 2, is preferably 0 or 1, and is most preferably 1.

In the present description, an oxime sulfonate-based acid generator is a compound having at least one group represented by general formula (B-1) shown below, and has a feature of generating acid upon irradiation. Such oxime sulfonate-based acid generators are widely used for chemically amplified resist compositions, and any of these compounds can be appropriately selected.

[Chemical Formula 13]

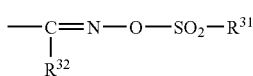

(B-1)

wherein $R^{31}$ and $R^{32}$ each independently represents an organic group.

The organic group for $R^{31}$ and $R^{32}$ refers to a group containing a carbon atom, and may also include atoms other than the carbon atom (such as a hydrogen atom, oxygen atom, nitrogen atom, sulfur atom or halogen atom (such as a fluorine atom or a chlorine atom) or the like).

As the organic group for $R^{31}$, a linear, branched or cyclic alkyl group or aryl group is preferable. The alkyl group or the aryl group may have a substituent. The substituent is not particularly limited, and examples thereof include a fluorine atom or a linear, branched or cyclic alkyl group having 1 to 6 carbon atoms. The expression "have a substituent" means that some or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms that has no substituent or a fluorinated alkyl group of 1 to 4 carbon atoms is particularly desirable.

As the organic group for $R^{32}$, a linear, branched or cyclic alkyl group, an aryl group, or a cyano group is preferable. Examples of the alkyl group and the aryl group for $R^{32}$ are the same as those exemplified for the alkyl group and the aryl group for $R^{31}$.

As $R^{32}$, a cyano group, an alkyl group of 1 to 8 carbon atoms having no substituent, or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 14]

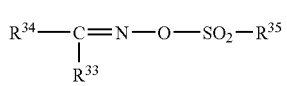

(B-2)

wherein $R^{33}$ represents a cyano group, an alkyl group having no substituent, or a halogenated alkyl group; $R^{34}$ represents an aryl group; and $R^{35}$ represents an alkyl group having no substituent or a halogenated alkyl group.

[Chemical Formula 15]

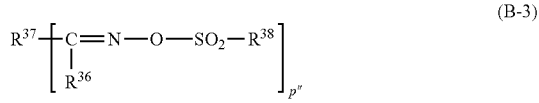

(B-3)

wherein $R^{36}$ represents a cyano group, an alkyl group having no substituent, or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more fluorinated, and most preferably 90% or more fluorinated.

Examples of the aryl group for $R^{34}$ include groups in which one hydrogen atom has been removed from an aromatic hydrocarbon ring, such as a phenyl group, biphenyl group, fluorenyl group, naphthyl group, anthracyl group or phenanthryl group, and heteroaryl groups in which some of the carbon atoms constituting the ring(s) of these groups are substituted with hetero atoms such as an oxygen atom, a sulfur atom or a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, a fluorinated alkyl group is more preferable, and a partially fluorinated alkyl group is the most desirable.

In terms of enhancing the strength of the acid generated, the fluorinated alkyl group for $R^{35}$ preferably has 50% or more of the hydrogen atoms fluorinated, more preferably 70% or more fluorinated, and still more preferably 90% or more fluorinated. A completely fluorinated alkyl group in which 100% of the hydrogen atoms are substituted with fluorine atoms is particularly desirable.

In general formula (B-3), the alkyl group having no substituent and the halogenated alkyl group for $R^{36}$ are the same as the alkyl group having no substituent and the halogenated alkyl group described above for $R^{33}$.

Examples of the divalent or trivalent aromatic hydrocarbon group for $R^{37}$ include groups in which an additional one or two hydrogen atoms have been removed from the aryl group described for $R^{34}$.

As the alkyl group having no substituent or the halogenated alkyl group for $R^{38}$, the same groups as those exemplified for the alkyl group having no substituent or the halogenated alkyl group for $R^{35}$ can be used.

p" is preferably 2.

Specific examples of oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may also be used favorably.

Furthermore, other preferred oxime sulfonate-based acid generators include the compounds shown below.

[Chemical Formula 16]

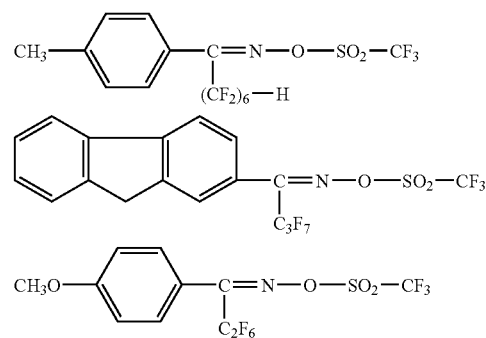

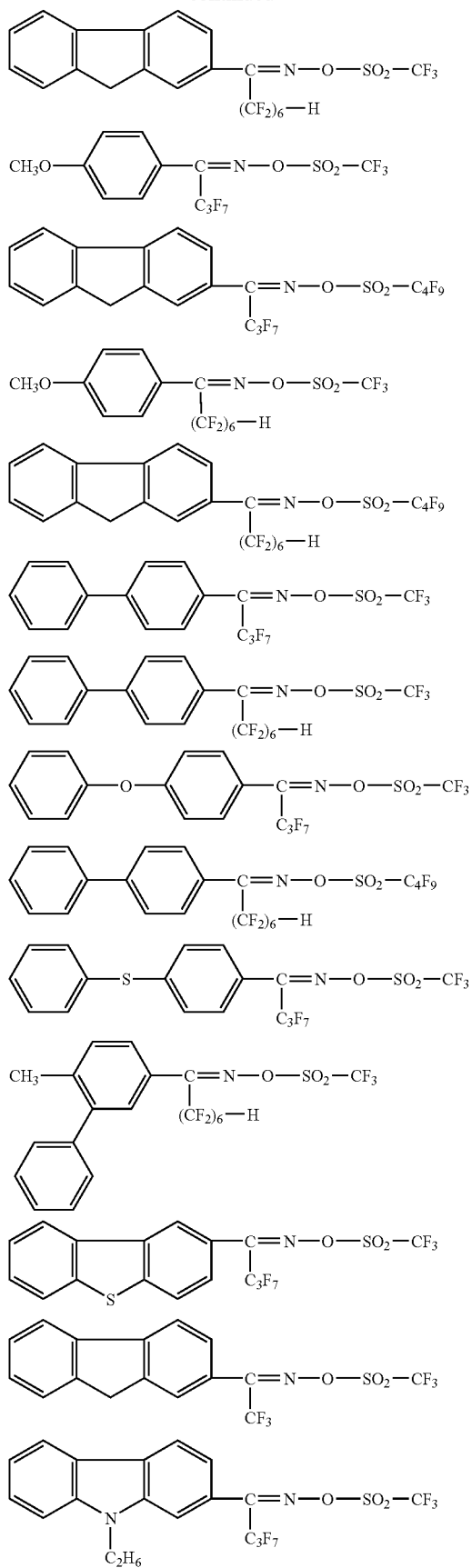

Of the compounds exemplified above, the four compounds shown below are particularly desirable.

[Chemical Formula 17]

Of the diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, the diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be favorably used.

Furthermore, examples of poly(bis-sulfonyl)diazomethanes include those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane.

As the component (B), one of the above types of acid generator may be used alone, or two or more types may be used in combination.

As the component (B), the component (b-5) is particularly preferred in terms of achieving superior lithography properties for the resulting resist composition. Furthermore, combinations of the component (b-5) with an onium salt-based acid generator having a fluorinated alkylsulfonate ion as the anion moiety are also preferred. Of the various possibilities, a combination of the component (b-5) and an onium salt-based generator represented by general formula (b-T) is particularly desirable.

The quantity of the component (B) in the present invention is typically 0.5 to 30 parts by weight, and preferably 1 to 10 parts by weight, relative to 100 parts by weight of the component (A). When the quantity of the component (B) is within the above-mentioned range, formation of a pattern can be performed satisfactorily. Further, by virtue of the above-mentioned range, a uniform solution can be obtained and the storage stability can be improved.

<Optional Components>

In the present invention, the chemically amplified positive silicon-based resist composition preferably also includes the optional components described below.

<Optional Component 1: γ-butyrolactone>

By including γ-butyrolactone as an optional component, the storage stability as a resist solution by particles can be improved without impairing the lithography properties. Here, an improvement in the "storage stability as a resist solution by particles" means that the storage stability when the chemically amplified positive silicon-based resist composition is converted to solution form can be enhanced. Specifically, the generation of fine particulate matter within the solution over time can be suppressed. This type of generation of fine particles over time tends to occur readily, particularly when a silsesquioxane resin is used. Moreover, this generation of fine particles over time may cause a deterioration in the lithography properties, and/or the occurrence of defects (surface defects) within the formed resist pattern. Here, the term "defects" refers to general abnormalities of a resist pattern, which are detected when the pattern is observed from directly above the developed resist pattern using a surface defect detection apparatus (trade name: "KLA") manufactured by KLA-TENCOR Corporation. Examples of these abnormalities include post-developing scum, foam, dust, bridges (that link different portions of the resist pattern), color irregularities, and foreign deposits.

As a method of improving the storage stability as a resist solution by particles, typically a method that involves adjustment of the composition of the base component has been used. For example, it is thought that by improving the solubility of the base component in organic solvents, the generation of foreign particles due to precipitation of dissolved components can be suppressed. However, in the case of a silicon-containing resin, altering the composition of the resin tends to often result in a deterioration in the lithography properties such as the sensitivity or resolution, and therefore modifying the resin composition is problematic.

In the present invention, by including γ-butyrolactone as an optional component, the storage stability as a resist solution by particles for the positive silicon-based resist composition can be improved without altering the composition of the silicon-containing resin, and without adversely affecting the lithography properties.

In the present invention, the quantity of the γ-butyrolactone within the positive silicon-based resist composition is preferably within a range from 1 to 600 parts by weight, more preferably from 3 to 100 parts by weight, still more preferably from 5 to 30 parts by weight, and most preferably from 10 to 20 parts by weight, relative to 100 parts by weight of the component (A). By ensuring the quantity is at least as large as the lower limit of the above-mentioned range, the effect described above can be achieved satisfactorily, whereas by ensuring the quantity is not more than the upper limit, the film formability and coatability and the like are improved when a resist film is formed using the resist composition.

<Optional Component 2: Compound (C)>

In the present invention, by including a compound (C) represented by general formula (c-1) shown below as an optional component, the occurrence of defects during resist pattern formation can be suppressed. Further, the shape of the formed resist pattern can also be improved.

"Defects" are as defined above, and when a high-resolution resist pattern is formed, and particularly when a fine pattern such as a resist pattern of 130 nm or less is formed using an ArF excimer laser or even shorter wavelength radiation as the exposure source, namely, an ArF excimer laser, a $F_2$ excimer laser, EUV or EB or the like, suppression of these defects is very important. As a method of suppressing the quantity of defects, typically a method that involves adjustment of the composition of the base component has been used, but as described above, altering the composition of a silicon-containing resin tends to invite a deterioration in the lithography properties such as the sensitivity or resolution.

In the present invention, by including the compound (C) as an optional component, the occurrence of defects can be suppressed for the positive silicon-based resist composition without altering the composition of the silicon-containing resin, and without adversely affecting the lithography properties.

[Chemical Formula 18]

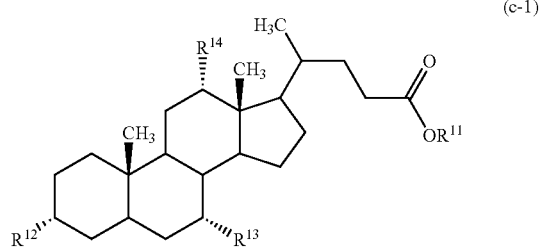

(c-1)

wherein $R^{11}$″ represents an acid-dissociable group, and $R^{12}$ to $R^{14}$ each independently represents a hydrogen atom or a hydroxyl group.

In formula (c-1), $R^{11}$ represents an acid-dissociable group. There are no particular limitations on the acid-dissociable group for $R^{11}$, provided it is a group that dissociates under the action of the acid generated from the component (B). For example, any of the acid-dissociable, dissolution-inhibiting groups proposed for the base resins used in conventional chemically amplified resists can be used.

Specific examples of preferred acid-dissociable, dissolution-inhibiting groups for $R^{11}$ include groups that form a cyclic or chain-like tertiary alkyl ester with the carboxyl group of (meth)acrylic acid or the like, and acetal-type acid-dissociable, dissolution-inhibiting groups such as alkoxyalkyl groups. The term "(meth)acrylic acid" refers to one or both of acrylic acid, in which a hydrogen atom is bonded at the α-position, and methacrylic acid, in which a methyl group is bonded at the α-position. A "(meth)ac late ester" refers to either one or both of the acrylate ester, in which a hydrogen atom is bonded at the α-position, and the methacrylate ester, in which a methyl group is bonded at the α-position. A "(meth)acrylate" refers to either one or both of the acrylate, in which a hydrogen atom is bonded at the α-position, and the methacrylate, in which a methyl group is bonded at the α-position.

Here, the term "tertiary alkyl ester" describes a structure in which an ester is formed by substituting the hydrogen atom of a carboxyl group with a chain-like or cyclic alkyl group, and a tertiary carbon atom within the chain-like or cyclic alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid-dissociable, dissolution-inhibiting groups".

Examples of tertiary alkyl ester-type acid-dissociable, dissolution-inhibiting groups include aliphatic branched, acid-dissociable, dissolution-inhibiting groups and aliphatic cyclic group-containing acid-dissociable, dissolution-inhibiting groups.

In the present description, the term "aliphatic" is a relative concept used in relation to the term "aromatic", and defines a group or a compound or the like that has no aromaticity.

The "aliphatic branched, acid-dissociable, dissolution-inhibiting group" is not limited to groups constituted of solely carbon atoms and hydrogen atoms (namely, not limited to hydrocarbon groups), but is preferably a hydrocarbon group. Further, the "hydrocarbon group" may be either saturated or unsaturated, but is preferably saturated.

As the aliphatic branched, acid-dissociable, dissolution-inhibiting group, tertiary alkyl groups of 4 to 8 carbon atoms are preferred, and specific examples thereof include a tert-butyl group, tert-amyl group and tert-heptyl group.

The "aliphatic cyclic group" within the "aliphatic cyclic group-containing acid-dissociable, dissolution-inhibiting group" may be monocyclic or polycyclic, and may or may not be substituted with a fluorinated hydroxyalkyl group. A "monocyclic aliphatic cyclic group" describes a monocyclic group that has no aromaticity, and a "polycyclic aliphatic cyclic group" describes a polycyclic group that has no aromaticity.

The aliphatic cyclic group includes both hydrocarbon groups (alicyclic groups) composed solely from carbon and hydrogen, and heterocyclic groups in which some of the carbon atoms that constitute the ring structure of the alicyclic group have been substituted with a hetero atom such as an oxygen atom, a nitrogen atom or a sulfur atom. The aliphatic cyclic group is preferably an alicyclic group.

The aliphatic cyclic group may be either saturated or unsaturated. A saturated group is preferred, as such groups exhibit superior transparency to ArF excimer lasers and the like, and also exhibit excellent resolution and depth of focus (DOF).

The number of carbon atoms within the aliphatic cyclic group is preferably within a range from 3 to 20, more preferably from 4 to 15, and most preferably from 5 to 15.

For the aliphatic cyclic group, examples of the monocyclic groups include groups in which one or more hydrogen atoms have been removed from a cycloalkane. Specific examples include groups in which one or more hydrogen atoms have been removed from cyclopentane or cyclohexane, and groups in which one or more hydrogen atoms have been removed from cyclohexane are particularly preferred.

Examples of the polycyclic groups include groups in which one or more hydrogen atoms have been removed from a bicycloalkane, tricycloalkane or tetracycloalkane or the like. Specific examples include groups in which one or more hydrogen atoms have been removed from a polycycloalkane such as adamantane, norbornane, isobornane, tricyclodecane or tetracyclododecane.

These types of polycyclic groups can be selected appropriately from the multitude of groups proposed as acid-dissociable, dissolution-inhibiting groups for the resins of positive photoresist compositions used within ArF excimer laser processes.

In terms of industrial availability, preferred monocyclic groups include groups in which one or more hydrogen atoms have been removed from cyclopentane or cyclohexane, and groups in which one or more hydrogen atom have been removed from cyclohexane are particularly desirable. Further, preferred polycyclic groups include groups in which one or more hydrogen atoms have been removed from adamantane, norbornane or tetracyclododecane.

Examples of the "aliphatic cyclic group-containing acid-dissociable, dissolution-inhibiting group" include groups having a tertiary carbon atom on the ring structure of a cyclic alkyl group. Specific examples include a 2-methyl-2-adamantyl group and a 2-ethyl-2-adamantyl group. Further, groups having an aliphatic cyclic group such as an adamantyl group, and a branched alkylene group having a tertiary carbon atom bonded thereto can also be exemplified.

An "acetal-type acid-dissociable, dissolution-inhibiting group" is generally substituted for the hydrogen atom at the terminal of an alkali-soluble group such as a carboxyl group or hydroxyl group, so as to be bonded with an oxygen atom. When acid is generated upon exposure, the action of the generated acid cleaves the bond between the acetal-type acid-dissociable, dissolution-inhibiting group and the oxygen atom to which the acetal-type acid-dissociable, dissolution-inhibiting group is bonded.

Examples of acetal-type acid-dissociable, dissolution-inhibiting groups include groups represented by general formula (p1) shown below.

[Chemical Formula 19]

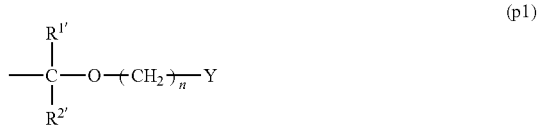

(p1)

wherein $R^{1'}$ and $R^{2'}$ each independently represents a hydrogen atom or a lower alkyl group, n represents an integer of 0 to 3, and Y represents a lower alkyl group or an aliphatic cyclic group.

In general formula (p1) above, n is preferably an integer of 0 to 2, more preferably 0 or 1, and is most preferably 0.

$R^{1'}$ and $R^{2'}$ each represents a hydrogen atom or a lower alkyl group. The lower alkyl group for $R^{1'}$ and $R^{2'}$ is an alkyl group of 1 to 5 carbon atoms, and specific examples thereof include linear or branched lower alkyl groups such as a methyl group, ethyl group, propyl group, isopropyl group, n-butyl group, isobutyl group, tert-butyl group, pentyl group, isopentyl group and neopentyl group. As the lower alkyl group for $R^{1'}$ and $R^{2'}$, a methyl group or ethyl group is preferable, and a methyl group is particularly desirable.

In the present invention, it is preferable that at least one of $R^{1'}$ and $R^{2'}$ is a hydrogen atom. In other words, it is preferable that the acid-dissociable, dissolution-inhibiting group (p1) is a group represented by general formula (p1-1) shown below.

[Chemical Formula 20]

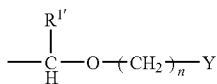
(p1-1)

wherein $R^{1'}$, n and Y are as defined above.

As the lower alkyl group for Y, the same groups as the lower alkyl group for $R^{1'}$ above can be exemplified.

As the aliphatic cyclic group for Y, any of the multitude of monocyclic or polycyclic aliphatic cyclic groups that have been proposed for conventional ArF resists and the like can be appropriately selected for use. For example, the same groups described above in connection with the "aliphatic cyclic group" can be exemplified.

Further, as the acetal-type acid-dissociable, dissolution-inhibiting group, groups represented by general formula (p2) shown below can also be exemplified.

[Chemical Formula 21]

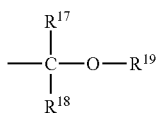
(p2)

wherein $R^{17}$ and $R^{18}$ each independently represents a linear or branched alkyl group or a hydrogen atom; and $R^{19}$ represents a linear, branched or cyclic alkyl group; or alternatively, $R^{17}$ and $R^{19}$ each independently represents a linear or branched alkylene group, wherein the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferred, and a methyl group is most preferable.

It is particularly desirable that either one of $R^{17}$ and $R^{18}$ is a hydrogen atom, and the other is a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and is most preferably an ethyl group.

When $R^{19}$ represents a cyclic group, it preferably has 4 to 15 carbon atoms, more preferably 4 to 12 carbon atoms, and most preferably 5 to 10 carbon atoms. Examples of the cycloalkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from either a monocycloalkane such as cyclopentane or cyclohexane, or a polycycloalkane such as adamantane, norbornane, isobornane, tricyclodecane or tetracyclododecane. Of these, a group in which one or more hydrogen atoms have been removed from adamantane is preferable.

In the above formula, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$. In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of this cyclic group include a tetrahydropyranyl group and a tetrahydrofuranyl group.

In the present invention, the acid-dissociable group of $R^{11}$ is preferably an aforementioned tertiary alkyl ester-type acid-dissociable, dissolution-inhibiting group, is more preferably a tertiary alkyl group containing 4 to 8 carbon atoms, and is most preferably a tert-butyl group.

$R^{12}$ to $R^{14}$ each independently represents a hydrogen atom or a hydroxyl group.

In the present invention, at least one of $R^{12}$ to $R^{14}$ preferably represents a hydroxyl group, and those compounds in which $R^{12}$ is a hydroxyl group are particularly desirable.

More specific examples of the compound (C) include a compound (c-1-1) represented by general formula (c-1-1) shown below, a compound (c-1-2) represented by general formula (c-1-2) shown below, a compound (c-1-3) represented by general formula (c-1-3) shown below, a compound (c-1-4) represented by general formula (c-1-4) shown below, and a compound (c-1-5) represented by general formula (c-1-5) shown below.

[Chemical Formula 22]

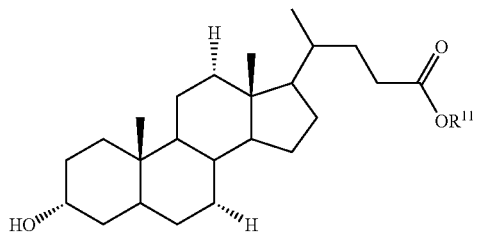
(c-1-1)

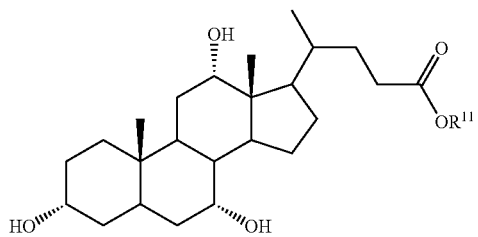
(c-1-2)

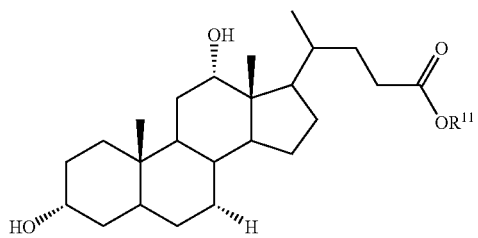
(c-1-3)

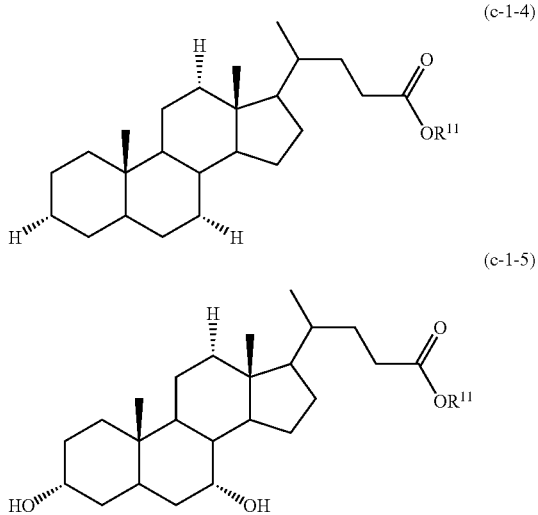

(c-1-4)

(c-1-5)

wherein, $R^{11}$ is as defined above.

The compound (C) can be produced by using a known method to substitute the hydrogen atom at the carboxyl group terminal of a compound (C') represented by general formula (c'-1) shown below with an acid-dissociable group.

For example, the above compounds (c-1-1) to (c-1-5) can be produced by using, as the compound (C'), lithocholic acid (a compound of formula (c'-1) in which $R^{12}$ represents a hydroxyl group and $R^{13}$ and $R^{14}$ each represents a hydrogen atom), cholic acid (a compound of formula (c'-1) in which $R^{12}$ to $R^{14}$ each represents a hydroxyl group), deoxycholic acid (a compound of formula (c'-1) in which $R^{12}$ and $R^{14}$ each represents a hydroxyl group and $R^{13}$ represents a hydrogen atom), cholanic acid (a compound of formula (c'-1) in which $R^{12}$ to $R^{14}$ each represents a hydrogen atom), and hyodeoxycholic acid (a compound of formula (c'-1) in which $R^{12}$ and $R^{13}$ each represents a hydroxyl group and $R^{14}$ represents a hydrogen atom).

[Chemical Formula 23]

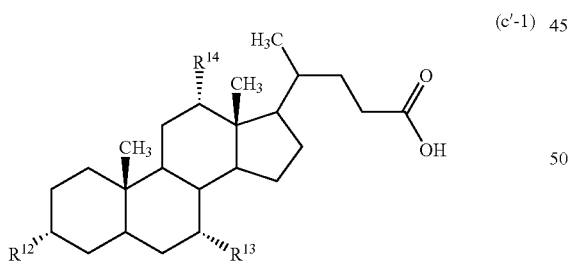

(c'-1)

wherein $R^{12}$ to $R^{14}$ are as defined above for $R^{12}$ to $R^{14}$ in formula (c-1).

As the component (C), either a single type of compound may be used alone, or two or more types may be used in combination.

In the present invention, of the compounds described above, the use of compound (c-1-1) and/or compound (c-1-2) is preferred, and the compound (c-1-1) is particularly desirable.

In the present invention, the quantity of the compound (C) within the chemically amplified positive silicon-based resist composition is preferably within a range from 0.1 to 20 parts by weight, more preferably from 1 to 15 parts by weight, and most preferably from 3 to 10 parts by weight, relative to 100 parts by weight of the component (A). By ensuring the quantity is at least as large as the lower limit of the above-mentioned range, the effect described above can be achieved satisfactorily, whereas by ensuring the quantity is not more than the upper limit, the sensitivity can be improved.

<Optional Component 3: Nitrogen-containing Organic Compound (D)>

In the present invention, a nitrogen-containing organic compound (D) (hereafter referred to as "component (D)") is also preferably included as an optional component. Including this component (D) improves the resist pattern shape and the post exposure stability of the latent image formed by the pattern-wise exposure of the resist layer.

A multitude of these components (D) have already been proposed, and any of these known compounds may be used. Examples of the component (D) include aliphatic amines such as a secondary aliphatic amine or tertiary aliphatic amine, and aromatic amines.

Here, as described above, the term "aliphatic" is a relative concept used in relation to the term "aromatic", and defines a group or compound or the like that has no aromaticity.

An "aliphatic amine" is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with a linear or branched alkyl group or hydroxyalkyl group of 1 to 12 carbon atoms (namely, alkylamines or alkyl alcohol amines), and aliphatic cyclic amines having an aliphatic cyclic group within the structure. Here, the term "aliphatic cyclic group" describes a monocyclic group or polycyclic group having no aromaticity.

Specific examples of alkylamines and alkyl alcohol amines include monoalkylamines such as n-hexylamine, n-heptylamine, n-octylamine, n-nonylamine and n-decylamine; dialkylamines such as diethylamine, di-n-propylamine, di-n-heptylamine, di-n-octylamine and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine and tri-n-dodecylamine; and alkyl alcohol amines such as diethanolamine, triethanolamine, diisopropanolamine, triisopropanolamine, di-n-octanolamine and tri-n-octanolamine.

Examples of the aliphatic cyclic amines include aliphatic heterocyclic compounds containing a nitrogen atom as a hetero atom. The heterocyclic compound may be a monocyclic compound (aliphatic monocyclic amine) or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine and 1,4-diazabicyclo[2.2.2]octane.

An "aromatic amine" is a compound in which at least one hydrogen atom of ammonia ($NH_3$) has been substituted with a group having aromaticity (hereafter frequently referred to as an "aromatic group").

Examples of aromatic groups include aromatic hydrocarbon groups and aromatic heterocyclic groups.

The aromatic hydrocarbon group preferably has 4 to 20 carbon atoms, more preferably 5 to 15 carbon atoms, and most preferably 6 to 10 carbon atoms. Specific examples of the aromatic hydrocarbon group include groups in which one hydrogen atom has been removed from an aromatic ring such as benzene, naphthalene or anthracene (namely, a phenyl group, naphthyl group or anthracenyl group); groups in which some of the hydrogen atoms of a linear or branched alkyl group of 1 to 5 carbon atoms have been substituted with an aromatic ring (such as a benzyl group, phenylethyl group ($C_6H_5$—$CH_2$—$CH_2$—), naphthylmethyl group ($C_{10}H_7$—$CH_2$—), or naphthylethyl group ($C_{10}H_7$—$CH_2$—$CH_2$—). In these groups, the aromatic ring may have a substituent, and examples of the substituent include alkyl groups of 1 to 5 carbon atoms.

An aromatic heterocyclic group is an aromatic cyclic group having a ring structure composed of carbon atoms and one or more hetero atoms other than a carbon atom (such as a nitrogen atom, oxygen atom or sulfur atom), and examples include groups in which one hydrogen atom has been removed from an aromatic heterocycle such as coumarin. These aromatic heterocyclic groups may have a substituent, and examples of the substituent include alkyl groups of 1 to 5 carbon atoms.

As the aromatic group, from the viewpoint of achieving a superior effect for the present invention, namely, superior formation of a very fine pattern having a high aspect ratio on a support, an aromatic heterocyclic group is preferred, and groups in which one hydrogen atom has been removed from a coumarin having a substituent are particularly desirable.

As the aromatic amine, a secondary amine and/or tertiary amine is preferable, and a tertiary amine is particularly desirable. The secondary and/or tertiary amine must include at least one aromatic group, and may also include a linear, branched or cyclic aliphatic hydrocarbon group of 1 to 5 carbon atoms, and/or a group in which one or more of the carbon atoms within an above-mentioned aliphatic hydrocarbon group have been substituted with a hetero atom such as a nitrogen atom.

As the aromatic amine, compounds represented by general formula (d-1) shown below are preferable.

[Chemical Formula 24]

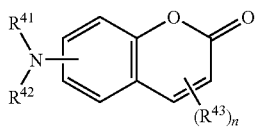

(d-1)

wherein $R^{41}$ and $R^{42}$ each independently represents an alkyl group of 1 to 10 carbon atoms, $R^{43}$ represents an alkyl group of 1 to 5 carbon atoms, and n represents an integer of 0 to 2.

As the component (D), one type of compound may be used alone, or two or more types may be used in combination.

In the present invention, the quantity of the component (D) within the chemically amplified positive silicon-based resist composition is preferably within a range from 0.01 to 10 parts by weight, and more preferably from 0.01 to 5 parts by weight, relative to 100 parts by weight of the component (A).

<Optional Component 4: Sulfonium Compound (E)>

In the present invention, a sulfonium compound (E) represented by general formula (e-1) shown below (hereafter frequently referred to as "component (E)") is also preferably included as an optional component. Including this component (E) suppresses fluctuation in the pH during storage of the resist composition in solution form, thus improving the storage stability. Particularly in those cases where the positive silicon-based resist composition includes the component (D) described above, the composition tends to be prone to fluctuations in the pH during storage in solution form, and therefore using the component (E) in combination with the component (D) is preferred.

[Chemical Formula 25]

(e-1)

wherein $R^{21}$ to $R^{23}$ each independently represents an alkyl group that may have a substituent, or an aryl group that may have a substituent.

There are no particular limitations on the alkyl groups for $R^{21}$ to $R^{23}$, and linear, branched or cyclic alkyl groups of 1 to 10 carbon atoms may be exemplified. Specific examples thereof include a methyl group, ethyl group, n-propyl group, isopropyl group, n-butyl group, isobutyl group, n-pentyl group, cyclopentyl group, hexyl group, cyclohexyl group, nonyl group and decanyl group.

The alkyl group may have a substituent. In other words, some or all of the hydrogen atoms of the alkyl group may be substituted with substituents. Examples of the substituent that may be bonded to the alkyl group include halogen atoms such as a fluorine atom, chlorine atom, bromine atom or iodine atom, and alkyl groups of 1 to 20 carbon atoms. As the substituent, alkyl groups of 1 to 5 carbon atoms are preferable, and a methyl group, ethyl group, propyl group, n-butyl group or tert-butyl group is the most desirable.

There are no particular limitations on the aryl groups for $R^{21}$ to $R^{23}$, and aryl groups of 6 to 20 carbon atoms may be exemplified. Specific examples thereof include a phenyl group and a naphthyl group. The aryl group may have a substituent. In other words, some or all of the hydrogen atoms of the aryl group may be substituted with substituents. Examples of the substituent that may be bonded to the aryl group include the same groups as those exemplified above for the substituent that may be bonded to the alkyl group.

Preferred examples of the component (E) include triphenyl compounds represented by general formula (e-2) shown below, and tricyclohexyl compounds represented by general formula (e-3) shown below.

Of these, triphenyl compounds represented by general formula (e-2) are preferred, and the compound in which $R^{201}$ to $R^{215}$ are all hydrogen atoms is particularly preferred.

[Chemical Formula 26]

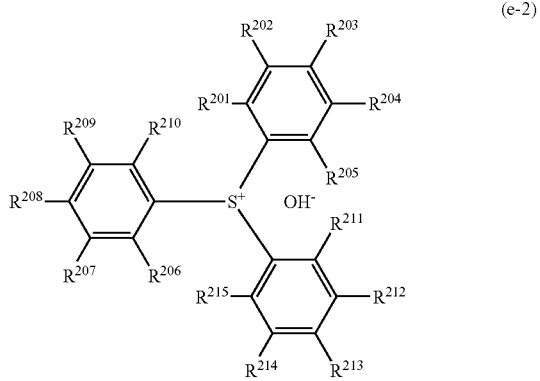

(e-2)

wherein $R^{201}$ to $R^{215}$ each independently represents a hydrogen atom, a halogen atom, or an alkyl group of 1 to 20 carbon atoms.

[Chemical Formula 27]

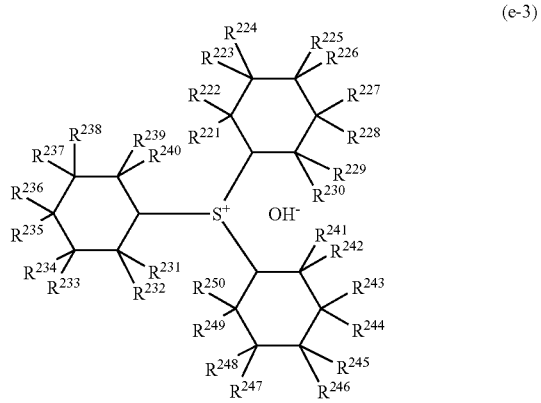

(e-3)

wherein $R^{221}$ to $R^{250}$ each independently represents a hydrogen atom, a halogen atom, or an alkyl group of 1 to 20 carbon atoms.

As the component (E), one type of compound may be used alone, or two or more types may be used in combination.

In the present invention, the quantity of the component (E) within the chemically amplified positive silicon-based resist composition is preferably within a range from 0.01 to 5 parts by weight, more preferably from 0.05 to 4 parts by weight, and most preferably from 0.1 to 3 parts by weight, relative to 100 parts by weight of the component (A).

<Optional Component 5: Compound (F)>

In the present invention, for the purposes of preventing any deterioration in sensitivity, and improving the resist pattern shape and the post exposure stability of the latent image formed by the pattern-wise exposure of the resist layer, at least one compound (F) (hereafter referred to as "component (F)") selected from the group consisting of organic carboxylic acids, and phosphorus oxo acids and derivatives thereof may also be added as an optional component.

Examples of suitable organic carboxylic acids include acetic acid, malonic acid, citric acid, malic acid, succinic acid, benzoic acid, and salicylic acid. Of these, malonic acid is particularly preferred.

Examples of phosphorus oxo acids or derivatives thereof include phosphoric acid, phosphonic acid and phosphinic acid. Among these, phosphonic acid is particularly desirable.

Examples of phosphorus oxo acid derivatives include esters in which the hydrogen atom within an above-mentioned oxo acid is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (F), one type of compound may be used alone, or two or more types may be used in combination.

The component (F) is typically used in a quantity within a range from 0.01 to 5.0 parts by weight, relative to 100 parts by weight of the component (A).

<Other Optional Components>

In the present invention, if required, other miscible additives may also be added as optional components. Examples of such miscible additives include additive resins for improving the performance of the resist film, surfactants for improving the coating properties, dissolution inhibitors, plasticizers, stabilizers, colorants, halation prevention agents, and dyes.

The chemically amplified positive silicon-based resist composition used in the present invention can be prepared by dissolving the materials for the resist composition in an organic solvent (hereafter, frequently referred to as "component (S)").

The component (S) may be any organic solvent that can dissolve the respective components to give a uniform solution, and any one or more kinds of organic solvents can be appropriately selected from those which have been conventionally known as solvents for chemically amplified resists.

Examples thereof include ketones such as acetone, methyl ethyl ketone, cyclohexanone, methyl-n-amyl ketone, methyl isoamyl ketone and 2-heptanone; polyhydric alcohols such as ethylene glycol, diethylene glycol, propylene glycol and dipropylene glycol; polyhydric alcohol derivatives, including compounds having an ester bond such as ethylene glycol monoacetate, diethylene glycol monoacetate, propylene glycol monoacetate and dipropylene glycol monoacetate, and compounds having an ether bond such as a monoalkyl ether (such as a monomethyl ether, monoethyl ether, monopropyl ether or monobutyl ether) or a monophenyl ether of any of the above polyhydric alcohols or compounds having an ester bond [among these derivatives, propylene glycol monomethyl ether acetate (PGMEA) and propylene glycol monomethyl ether (PGME) are preferred]; cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethyl benzyl ether, cresyl methyl ether, diphenyl ether, dibenzyl ether, phenetole, butyl phenyl ether, ethylbenzene, diethylbenzene, amylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be determined appropriately with due consideration of the compatibility of the PGMEA with the polar solvent, but is preferably in the range from 1:9 to 9:1, and more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and is most preferably from 5:5 to 8:2.

The quantity of the component (S) is not particularly limited, and is appropriately adjusted to a concentration that enables coating of a coating solution to a substrate in accordance with the thickness of the coating. In general, the organic solvent is used in a quantity that yields a solid content for the resist composition that is within a range from 2 to 20% by weight, and preferably from 5 to 15% by weight.

<<Hard Mask>>

There are no particular limitations on the hard mask used in the present invention, provided the mask is formed as a resist underlayer film, using a silicon-based hard mask-forming material. Of the various possibilities, a composition containing a siloxane-based polymer is preferred, and a composition that includes a siloxane-based polymer (BH) and a siloxane-based compound (AH) having a weight average molecular weight of 3,000 or less (hereafter this composition is frequently referred to as the "hard mask-forming composition") is particularly preferred. A detailed description of this type of hard mask is presented below.

<Siloxane-based Compound (AH)>

The siloxane-based compound (AH) has a weight average molecular weight of 3,000 or less. By ensuring that the weight average molecular weight is within this type of range, tailing of the resist pattern formed on top of the hard mask can be reduced, and the pattern shape can be improved.

As the siloxane-based compound (AH), compounds having a ladder structure, a cyclic structure or a cage structure such as those shown below in general formulas (ah-1), (ah-2) and (ah-3) are preferable.

[Chemical Formula 28]

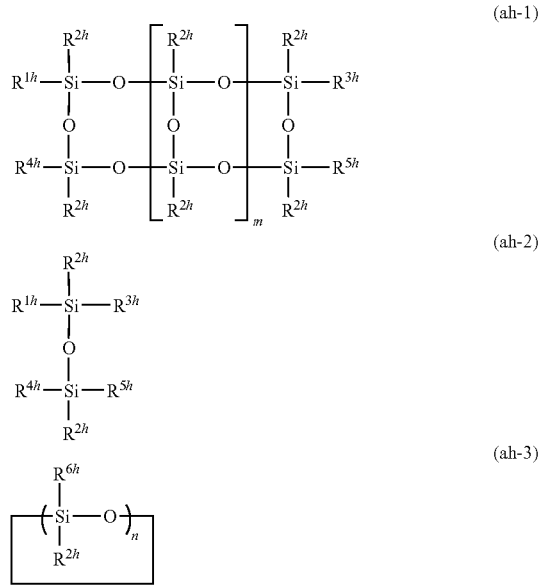

(ah-1)

(ah-2)

(ah-3)

wherein $R^{1h}$, $R^{3h}$, $R^{4h}$, $R^{5h}$ and $R^{6h}$ each independently represents a hydrogen atom, a hydroxyl group, an alkyl group or an alkoxy group, each $R^{2h}$ independently represents a linear, branched or cyclic hydrocarbon group, $R^{1h}$ and $R^{3h}$, and/or $R^{4h}$ and $R^{5h}$ in formula (ah-1) may be combined as an —O— group, m represents an integer of 1 to 8, and n represents an integer of 2 to 8.

The alkyl group and alkoxy group for $R^{1h}$, $R^{3h}$, $R^{4h}$, $R^{5h}$ and $R^{6h}$ are preferably groups of 1 to 3 carbon atoms.

Specific examples of these alkyl groups include a methyl group, ethyl group, propyl group and isopropyl group.

Specific examples of these alkoxy groups include a methoxy group, ethoxy group and propoxy group.

In the compounds represented by general formulas (ah-1) and (ah-2), at least 25 mol % of the combination of $R^{1h}$, $R^{3h}$, $R^{4h}$ and $R^{5h}$ are preferably hydroxyl groups.

Further, in the compound represented by general formula (ah-3), at least 25 mol % of the $R^{6h}$ groups are preferably hydroxyl groups.

The hydrocarbon group for $R^{2h}$ is preferably a linear, branched or cyclic aliphatic hydrocarbon group of 1 to 18 carbon atoms, or an aromatic hydrocarbon group. Examples of the linear, branched or cyclic hydrocarbon group include alkyl groups such as a methyl group, ethyl group, propyl group, isopropyl group, t-butyl group, pentyl group, neopentyl group, hexyl group, octyl group, nonyl group, decyl group, undecyl group or dodecyl group; alkenyl groups such as a vinyl group, allyl group or propenyl group; and cyclic alkyl groups such as a cyclopentyl group, cyclohexyl group, norbornyl group, norbornenyl group or adamantyl group. Examples of the aromatic hydrocarbon group include aryl groups such as a phenyl group, naphthyl group, methylphenyl group, ethylphenyl group, tolyl group, chlorophenyl group, bromophenyl group or fluorophenyl group; and aralkyl groups such as a benzyl group, phenethyl group, naphthylmethyl group, diphenylmethyl group, triphenylmethyl group or 1-methyl-1-phenylethyl group. These hydrocarbon groups may have a substituent, and examples of the substituent include a hydroxyl group or an alkoxy group of 1 to 3 carbon atoms.

Of these groups, particularly preferred groups for $R^{2h}$ include a norbornyl group and groups represented by formula (ah-4) shown below.

[Chemical Formula 29]

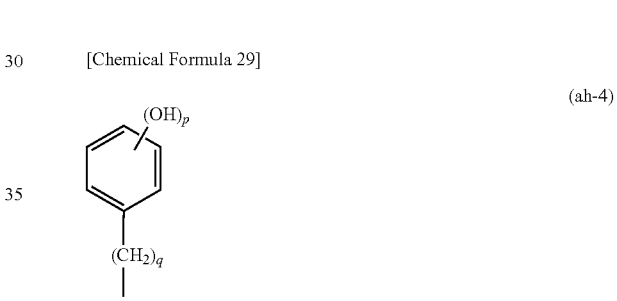

(ah-4)

wherein p represents either 0 or 1, and q is an integer of 0 to 5.

Groups represented by the formula (ah-4) are particularly desirable, as they provide superior compatibility with the component (BH) described below and with organic solvents.

In siloxane-based compounds represented by formula (ah-1) and (ah-2), groups represented by formula (ah-4) preferably represent at least 10 mol %, and more preferably 25 mol % or more, of the $R^{2h}$ groups. Furthermore, in a siloxane-based compound represented by formula (ah-3), groups represented by formula (ah-4) preferably represent at least 12.5 mol %, and more preferably 25 mol % or more, of the $R^{2h}$ groups. By ensuring that the quantity of $R^{2h}$ groups is at least as large as the above-mentioned values, the compatibility of the siloxane-based compound (AH) with organic solvents can be improved significantly.

Further, in a compound of formula (ah-1), $R^{1h}$ and $R^{3h}$, and/or $R^{4h}$ and $R^{5h}$ may be combined as an —O— group. In such cases, a cage structure is formed. In the case of a cage structure, m is preferably an integer of 2 to 4, resulting in a substantially cubic T8 structure, a substantially pentagonal prismatic T10 structure, or a substantially hexagonal prismatic T12 structure respectively.

As specific examples of the siloxane-based compounds represented by general formulas (ah-1) and (ah-3), compounds of the structural formulas (ah-1-1), (ah-1-2) and (ah-1-3) shown below are preferable.

[Chemical Formula 30]

(ah-1-1)
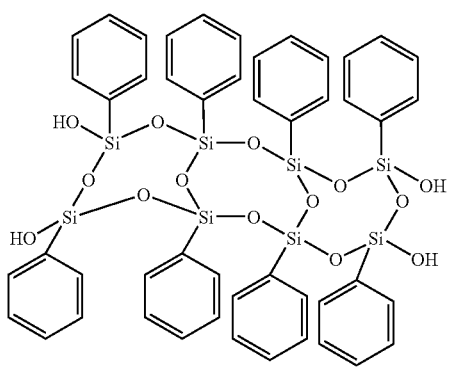

(ah-1-2)
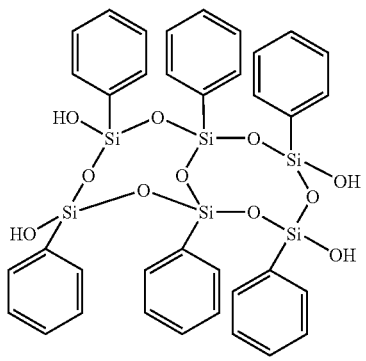

(ah-3-1)
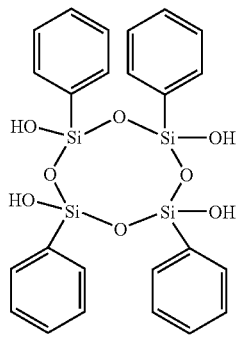

Moreover, compounds in which at least 25% of the hydroxyl groups within the compounds (ah-1-1), (ah-1-2) and (ah-3-1) shown above have been substituted with alkoxy groups such as a methoxy group or ethoxy group are also preferable.

The upper limit for the weight average molecular weight of the siloxane-based compound (AH) is 3,000, and is more preferably 2,800. Furthermore, the lower limit for the weight average molecular weight is preferably 300, and more preferably 500. By setting the lower limit to 300, evaporation of the siloxane-based compound can be suppressed, and the film formability of the hard mask composition can be improved.

<Siloxane-based Polymer (BH)>

The siloxane-based polymer (BH) has a structural unit represented by general formula (bh-1) shown below.

[Chemical Formula 31]

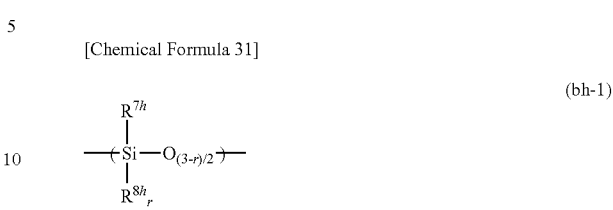

(bh-1)

wherein $R^{7h}$ represents a light-absorbing group, $R^{8h}$ represents a hydrogen atom, a hydroxyl group, or an alkyl group or alkoxy group of 1 to 6 carbon atoms, and r represents either 0 or 1.

The light-absorbing group is a group that absorbs light having a wavelength within a range from 150 to 300 nm. Examples of this light-absorbing group include groups having a light-absorbing portion such as a benzene ring, an anthracene ring or a naphthalene ring. The light-absorbing portion may be bonded to the Si atom of the main structure via an alkylene group of 1 to 20 carbon atoms that may be interrupted with one or more —O— or —O(CO)— groups. Further the light-absorbing portion such as the benzene ring, anthracene ring or naphthalene ring may be substituted with one or more substituents such as an alkyl group or alkoxy group of 1 to 6 carbon atoms or a hydroxyl group. Among these light-absorbing groups, a benzene ring is preferable. Furthermore, besides the light-absorbing groups described above, a group having a light-absorbing portion containing a Si—Si bond may also be used. Moreover, these light-absorbing portions may be included within the main structure of the siloxane-based polymer. Specific examples of the light-absorbing group include aryl groups such as a phenyl group, naphthyl group, methylphenyl group, ethylphenyl group, tolyl group, chlorophenyl group, bromophenyl group or fluorophenyl group; and aralkyl groups such as a benzyl group, phenethyl group, naphthylmethyl group, diphenylmethyl group, triphenylmethyl group or 1-methyl-1-phenylethyl group. Of these, a phenyl group is preferred. Using a phenyl group as the light-absorbing group yields particularly favorable light absorption, and also improves the etching resistance of the resulting hard mask to oxygen-based plasmas.

Moreover, the siloxane-based polymer (BH) preferably also includes at least one structural unit represented by general formula (bh-2).

[Chemical Formula 32]

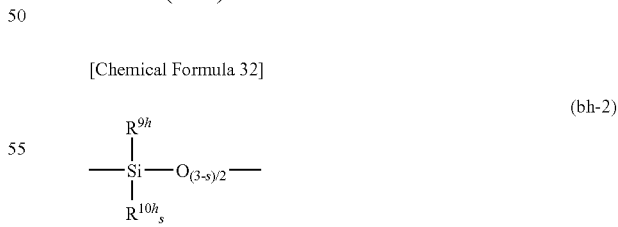

(bh-2)

wherein $R^{9h}$ represents a hydrogen atom, an alkyl group, or a monovalent organic group having at least one functional group selected from the group consisting of a carbonyl group, ester group, lactone group, amide group, ether group and nitrile group (wherein the functional group has 1 to 6 carbon atoms); $R^{10h}$ represents a hydrogen atom, a hydroxyl group, or an alkyl group or alkoxy group of 1 to 6 carbon atoms, and s represents either 0 or 1.

The lower limit for the weight average molecular weight of the siloxane-based polymer (BH) is 8,000, and is more preferably 10,000. By ensuring that the weight average molecular weight of the component (BH) is at least 8,000, the film formability of the hard mask can be improved. Further, the upper limit for the weight average molecular weight of the component (BH) is preferably 50,000, and more preferably 30,000. By ensuring that the weight average molecular weight of the component (BH) is not more than 50,000, the coating properties of the hard mask-forming composition can be improved.

<Method of Producing Siloxane-based Polymer (BH)>

In a similar manner to the siloxane-based compound (AH), the siloxane-based polymer (BH) can be produced by hydrolyzing and polymerizing monomers containing each of the required structural units.

The ratio between the component (AH) and the component (BH) within the hard mask-forming composition, reported as a weight ratio, is preferably within a range from 1:9 to 7:3, more preferably from 3:7 to 6:4, and is most preferably 5:5. By ensuring that the ratio between the component (AH) and the component (BH) is within the above-mentioned range, tailing of the resist pattern that is formed on top of the hard mask formed using the above composition can be reduced.

Moreover, by using quantities of the component (AH) and the component (BH) that satisfy the above range, a hard mask can be formed that is capable of forming a pattern of favorable shape even without the addition of an acid generator.

<Solvent (CH)>

The hard mask-forming composition also includes a solvent (CH) (hereafter also referred to as "component (CH)"). Specific examples of this solvent include monohydric alcohols such as methyl alcohol, ethyl alcohol, propyl alcohol and butyl alcohol; other alcohols such as ethylene glycol, diethylene glycol, propylene glycol, glycerol, trimethylolpropane and hexanetriol; alcohol monoethers such as ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monopropyl ether, diethylene glycol monobutyl ether, propylene glycol monomethyl ether (PGME), propylene glycol monoethyl ether, propylene glycol monopropyl ether and propylene glycol monobutyl ether; esters such as monoacetates of the above monoether compounds, methyl acetate, ethyl acetate, butyl acetate and ethyl lactate (EL); ketones such as acetone, methyl ethyl ketone, cycloalkyl ketones and methyl isoamyl ketone; and alcohol ethers in which all of the hydroxyl groups of an alcohol have been alkyl etherified, such as ethylene glycol dimethyl ether, ethylene glycol diethyl ether, ethylene glycol dipropyl ether, ethylene glycol dibutyl ether, propylene glycol dimethyl ether (PGDM), propylene glycol diethyl ether, propylene glycol dibutyl ether, diethylene glycol dimethyl ether, diethylene glycol methyl ethyl ether, and diethylene glycol diethyl ether.

Of these, propylene glycol monomethyl ether acetate (PGMEA), PGME and EL are preferred.

These organic solvents may be used either individually, or in a combination containing two or more different solvents.

Furthermore, a mixed solvent obtained by mixing PGMEA with a polar solvent is preferable. The mixing ratio (weight ratio) of the mixed solvent can be determined appropriately with due consideration of the compatibility of the PGMEA with the polar solvent, but is preferably in the range from 1:9 to 9:1, and more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and is most preferably from 3:7 to 7:3.

The quantity of this solvent is typically from T- to 100-fold, and preferably from 2- to 20-fold, the combined weight of the component (AH) and the component (BH). By ensuring a quantity within this range, the coating properties of the hard mask-forming composition can be improved.

<Cross-linker (DH)>

The hard mask-forming composition may also include a cross-linker (DH) (hereafter also referred to as "component (DH)"). By adding the cross-linker (DH), the film formability of the hard mask can be improved. As the cross-linker, typically used cross-linkers may be used.

Specific examples thereof include epoxy compounds such as bisphenol A epoxy resins, bisphenol F epoxy resins, bisphenol S epoxy resins, phenol novolak epoxy resins and cresol novolak epoxy resins. Further, divinylbenzene, divinylsulfonic acid, triacrylformal, and acrylate esters or methacrylate esters of glyoxal or polyhydric alcohols can also be used.

Compounds having two or more reactive groups, such as compounds in which at least two amino groups of melamine, urea, benzoguanamine or glycoluril have been substituted with methylol groups, lower alkoxymethyl groups or lower acyloxymethyl groups may also be exemplified. The number of carbon atoms within the above lower alkoxymethyl groups or lower acyloxymethyl groups is preferably 2 to 6.

Examples of compounds in which at least two amino groups of melamine have been substituted with methylol groups or lower alkoxymethyl groups include hexamethylolmelamine, hexamethoxymethylmelamine, compounds in which 1 to 6 of the methylol groups of hexamethylolmelamine have been methoxymethylated, and mixtures thereof; and hexaethoxymethylmelamine, hexaacyloxymethylmelamine, compounds in which 1 to 5 of the methylol groups of hexamethylolmelamine have been acyloxymethylated, and mixtures thereof.

Examples of compounds in which at least two amino groups of urea have been substituted with methylol groups or lower alkoxymethyl groups include tetramethylolurea, tetramethoxymethylurea, tetraethoxymethylurea, compounds in which 1 to 4 of the methylol groups of tetramethylolurea have been methoxymethylated, and mixtures thereof.

Examples of compounds in which at least two amino groups of benzoguanamine have been substituted with methylol groups, lower alkoxymethyl groups or lower acyloxymethyl groups include tetramethylolbenzoguanamine, tetramethoxymethylbenzoguanamine, compounds in which 1 to 4 of the methylol groups of tetramethylolbenzoguanamine have been methoxymethylated, and mixtures thereof, and tetraethoxymethylbenzoguanamine, tetraacyloxymethylbenzoguanamine, compounds in which 1 to 4 of the methylol groups of tetramethylolbenzoguanamine have been acyloxymethylated, and mixtures thereof.

Examples of compounds in which at least two amino groups of glycoluril have been substituted with methylol groups, lower alkoxymethyl groups or lower acyloxymethyl groups include tetramethylolglycoluril, tetramethoxyglycoluril, tetramethoxymethylglycoluril, compounds in which 1 to 4 of the methylol groups of tetramethylolglycoluril have been methoxymethylated, and mixtures thereof, and compounds in which 1 to 4 of the methylol groups of tetramethylolglycoluril have been acyloxymethylated, and mixtures thereof.

These cross-linkers may be used individually, or in a combination containing two or more different cross-linkers. The quantity added of the cross-linker is typically within a range from 0.1 to 50 parts by weight, and preferably from 0.5 to 40 parts by weight, relative to 100 parts by weight of the combined weight of the component (AH) and the siloxane-based polymer (BH).

<Acid Generator (EH)>

The hard mask-forming composition may also include an acid generator (EH) (hereafter also referred to as "component (EH)").

As this acid generator, conventional acid generators may be used, including onium salts, diazomethane derivatives, glyoxime derivatives, bis-sulfone derivatives, 1-ketosulfone derivatives, disulfone derivatives, nitrobenzyl sulfonate derivatives, sulfonate ester derivatives, and sulfonate ester derivatives of N-hydroxyimide compounds.

Examples of the onium salts include tetramethylammonium trifluoromethanesulfonate, tetramethylammonium nonafluorobutanesulfonate, tetra-n-butylammonium nonafluorobutanesulfonate, tetraphenylammonium nonafluorobutanesulfonate, tetramethylammonium p-toluenesulfonate, diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, ethylenebis[methyl(2-oxocyclopentyl)sulfonium trifluoromethanesulfonate], and 1,2'-naphthylcarbonylmethyltetrahydrothiophenium triflate.

Examples of the diazomethane derivatives include bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane.

Examples of the glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Examples of the bissulfone derivatives include bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane.

Examples of the β-ketosulfone derivatives include 2-cyclohexylcarbonyl-2-(p-toluenesulfonyl)propane and 2-isopropylcarbonyl-2-(p-toluenesulfonyl)propane.

Examples of the disulfone derivatives include diphenyl disulfone derivatives and dicyclohexyl disulfone derivatives.

Examples of the nitrobenzyl sulfonate derivatives include 2,6-dinitrobenzyl p-toluenesulfonate and 2,4-dinitrobenzyl p-toluenesulfonate.

Examples of the sulfonate ester derivatives include 1,2,3-tris(methanesulfonyloxy)benzene, 1,2,3-tris(trifluoromethanesulfonyloxy)benzene, and 1,2,3-tris(p-toluenesulfonyloxy)benzene.

Examples of the sulfonate esters of N-hydroxyimide compounds include N-hydroxysuccinimide methanesulfonate, N-hydroxysuccinimide trifluoromethanesulfonate, N-hydroxysuccinimide ethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide 1-octanesulfonate, N-hydroxysuccinimide p-toluenesulfonate, N-hydroxysuccinimide p-methoxybenzenesulfonate, N-hydroxysuccinimide 2-chloroethanesulfonate, N-hydroxysuccinimide benzenesulfonate, N-hydroxysuccinimide 2,4,6-trimethylbenzenesulfonate, N-hydroxysuccinimide 1-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy-5-norbornene-2,3-dicarboxylmide methanesulfonate, N-hydroxy-5-norbornene-2,3-dicarboxylmide trifluoromethanesulfonate, and N-hydroxy-5-norbornene-2,3-dicarboxylmide p-toluenesulfonate.

These acid generators may be used individually, or in a combination containing two or more different acid generators.

The quantity added of this acid generator is typically within a range from 0.1 to 50 parts by weight, and preferably from 0.5 to 40 parts by weight, relative to 100 parts by weight of the combined weight of the component (AH) and the component (BH).

The hard mask-forming composition of the present invention can be prepared by mixing the necessary components from among component (AH) through component (EH). The thus obtained hard mask-forming composition is preferably filtered through a filter.

<Method of Forming Hard Mask>

In order to form a hard mask using the preferred hard mask-forming composition described above, a spin coater or slit nozzle coater or the like is used to apply the composition to a film undergoing processing (or in some cases, a bottom layer formed on the film undergoing processing), and following drying, the composition is heated. The heating may be conducted using a single stage heating method or a multistage heating method. In the case of a multistage heating method, the composition is preferably first heated, for example, at 100 to 120° C. for a period of 60 to 120 seconds, and then heated at 200 to 250° C. for a period of 60 to 120 seconds.

The thickness of a hard mask formed in this manner is preferably within a range from 20 to 150 nm. Subsequently, a resist film composition can be used to provide a resist film having a thickness of 100 to 200 nm on top of the hard mask.

<<Support>>

There are no particular restrictions on the support, and conventional supports can be used, including substrates for electronic componentry, as well as substrates on which a predetermined wiring pattern has already been formed. Specific examples of suitable supports include silicon wafers, metal substrates composed of a metal such as copper, chromium, iron or aluminum, and glass substrates. Suitable materials for the wiring pattern include copper, aluminum, nickel, and gold.

<<Underlayer Film>>

Conventional materials can be used for the underlayer film, including both inorganic and organic films, although an organic film that can be subjected to dry etching is preferred. For example, the types of organic films typically used in conventional multilayer resist methods can be used.

Of the various possibilities, materials that are capable of forming an organic film that can be etched by oxygen plasma etching or the like are particularly preferred.

As this type of organic film-forming material, the materials conventionally used for forming organic films such as organic antireflective films (organic BARC) are suitable. Examples include the ARC series of products manufactured by Brewer Science Ltd., the AR series of products manufactured by Rohm and Haas Company, and the SWK series of products manufactured by Tokyo Ohka Kogyo Co., Ltd.

Of these, in those cases where, as described above, oxygen plasma etching is used in the etching step, the organic film is preferably formed using a material that is readily etched using oxygen plasma etching, but exhibits comparatively high resistance to halogen gases, and specifically fluorocarbon gases such as $CF_4$ gas or $CHF_3$ gas.

These materials are ideal for the present invention as they are readily etched by oxygen plasma etching or the like, and also display superior resistance to fluorocarbon gases. In other words, because etching of the substrate or the like is generally conducted using a halogen gas such as a fluorocarbon gas, by forming the organic film from these types of materials, oxygen plasma etching can be used to improve the processability during formation of the organic film pattern, while the etching resistance can be improved in subsequent steps that use a halogen gas such as a fluorocarbon gas to conduct etching of the substrate.

These resin components may be used either individually, or in mixtures containing two or more different resins.

If desired, other miscible additives can also be added to the organic film-forming material. Examples of such miscible additives include additive resins for improving the properties of the organic film, surfactants for improving the coating properties, dissolution inhibitors, plasticizers, stabilizers, colorants and halation prevention agents.

The organic film-forming material can be prepared by dissolving the materials such as the aforementioned resin component within an organic solvent. As the organic solvent, the same solvents as those exemplified above for the component (S) of the aforementioned chemically amplified positive silicon-based resist composition may be used.

<<Chemically Amplified Positive Resist Composition>>

As the chemically amplified positive resist composition, conventional compositions may be used without any particular limitations. For example, a composition including a base component that contains acid-dissociable, dissolution-inhibiting groups and exhibits increased alkali solubility under the action of acid, and an acid generator component that generates acid upon exposure may be exemplified.

This type of positive resist composition is alkali-insoluble prior to exposure, but during resist pattern formation, when acid is generated from the acid generator component upon exposure, the acid-dissociable, dissolution-inhibiting groups are dissociated by the action of the acid, and the base component becomes alkali-soluble. Accordingly, during the formation of a resist pattern, by conducting selective exposure of a resist film obtained by applying the positive resist composition onto a substrate, the exposed portions become alkali-soluble, whereas the unexposed portions remain alkali-insoluble, meaning alkali developing can then be conducted.

<<Method of Forming Pattern>>

A method of forming a pattern according to the present invention includes: forming an underlayer film on a support using an underlayer film-forming material, forming a hard mask on the underlayer film using a silicon-based hard mask-forming material, forming a first resist film by applying a chemically amplified positive resist composition to the hard mask, forming a first resist pattern by selectively exposing the first resist film through a first mask pattern and then performing developing, forming a first pattern by etching the hard mask using the first resist pattern as a mask (hereafter, the steps up until this point are referred to as the "patterning process (1)"), forming a second resist film by applying a chemically amplified positive silicon-based resist composition to the first pattern, forming a second resist pattern by selectively exposing the second resist film through a second mask pattern and then performing developing, and forming a second pattern by etching the underlayer film using the first pattern and the second resist pattern as a mask (hereafter, the steps from after the patterning process (1) through until this point are referred to as the "patterning process (2)"). The method is described in further detail below with reference to the drawings.

<Patterning Step (1)>

FIG. 1A to FIG. 1E are schematic process diagrams illustrating the patterning process (1) of a preferred embodiment of a method of forming a pattern according to the present invention.

In this embodiment, first, as shown in FIG. 1A, an underlayer film 2 is formed on a support 1 using the underlayer film-forming material described above, a hard mask 3 is formed on the underlayer film 2 using the silicon-based hard mask-forming material described above, and a first resist film 4 is formed by applying a chemically amplified positive resist composition to the hard mask 3. The steps for forming the underlayer film 2, the hard mask 3 and the first resist film 4 may employ conventional methods.

For example, there are no particular limitations on the method used for applying the underlayer film-forming material to the support 1, and a spraying method, roll coating method or spin coating method or the like may be selected appropriately in accordance with the underlayer film-forming material.

The thickness of the underlayer film 2 may be selected appropriately so as to achieve a balance between the desired aspect ratio and the throughput, with due consideration of the time taken for dry etching of the underlayer film 2, and is preferably not less than 150 nm and not more than 500 nm, more preferably not less than 200 nm and not more than 350 nm, and still more preferably not less than 200 nm and not more than 300 nm. By ensuring that the thickness of the underlayer film 2 is within the above-mentioned range, a resist pattern having a high aspect ratio can be formed.

The term "aspect ratio" represents the ratio (y/x) of the height (y) of the pattern formed on the support relative to the pattern width (x) of the resist pattern. The pattern width (x) of the resist pattern is the same as the pattern width following transfer to the underlayer film.

In those cases where the resist pattern is a line-type pattern such as a line and space pattern or an isolated line pattern, the "pattern width" describes the width of a raised portion (line). In those cases where the resist pattern is a hole pattern, the "pattern width" describes the inner diameter of the formed hole. Further, in those cases where the resist pattern is a cylindrical dot pattern, the "pattern width" describes the diameter of the dots.

In each case, the pattern width refers to the width at the bottom of the pattern (closest to the support).

Furthermore, there are no particular limitations on the method used for applying the hard mask-forming material to the underlayer film 2, and the same methods as those described above for forming the hard mask using a preferred hard mask-forming composition may be used.

The thickness of the hard mask 3 is preferably not less than 20 nm and not more than 150 nm, and more preferably not less than 30 nm and not more than 50 nm.

The silicon content within the silicon-based hard mask-forming material is preferably at least 20%, and more preferably 30% or higher, as such values enable favorable formation of a pattern having a high aspect ratio.

The chemically amplified positive resist composition may be applied to the hard mask 3 using a spinner or the like, and the thus formed coating film may then be subjected to a bake treatment (prebake) to form the first resist film 4.

The thickness of the first resist film 4 may be selected appropriately so as to achieve a balance between the desired aspect ratio and the throughput, with due consideration of the time taken for dry etching of the hard mask 3, and is preferably not less than 50 nm and not more than 200 nm, and more preferably not less than 100 nm and not more than 200 nm. By ensuring that the thickness of the first resist film 4 is not more than 200 nm, a resist pattern can be formed at a high resolution, whereas ensuring a thickness of not less than 50 nm yields effects such as a satisfactory resistance to dry etching.

Figure 1B:
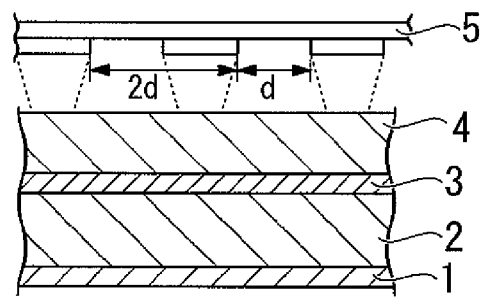
FIG. 1B is as described for FIG. 1A.

Subsequently, as shown in FIG. 1B, the first resist film 4 is selectively exposed through a first mask pattern 5, the resist film 4 is optionally subjected to another bake treatment (post exposure bake (PEB)), and the resist film 4 is then developed to form a first resist pattern 4'. The selective exposure and developing may be conducted using conventional methods. The first mask pattern 5 used in this step may be selected appropriately in accordance with the pattern that is required. The figure shows an example in which the space width is (d) and the pitch is (2d), but the present embodiment is not limited to these values.

The are no particular limitations on the selective exposure conditions. The exposure region, exposure time and exposure intensity and the like may be selected appropriately in accordance with the radiation source and the method used for the exposure.

There are no particular limitations on the radiation source used for the exposure, and radiation from an ArF excimer laser, KrF excimer laser, $F_2$ excimer laser, EUV (extreme ultra violet), VUV (vacuum ultra violet), EB (electron beam), X-rays or soft X-rays can be used.

There are no particular limitations on the alkali developing solution used for the developing, and for example, an aqueous solution of tetramethylammonium hydroxide having a concentration of not less than 0.05% by weight and not more than 10% by weight, and more preferably not less than 0.05% by weight and not more than 3% by weight, may be used.

Figure 1C:
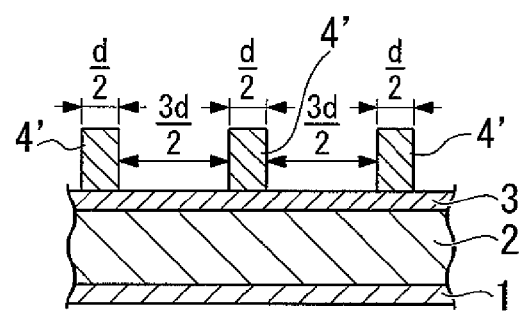
FIG. 1C is as described for FIG. 1A.

If a composition including a base component that contains acid-dissociable, dissolution-inhibiting groups and exhibits increased alkali solubility under the action of acid, and an acid generator component that generates acid upon exposure is used as the chemically amplified positive resist composition, then selective exposure causes acid to be generated within the exposed portions, and the action of that acid causes the acid-dissociable, dissolution-inhibiting groups to dissociate, making the base component change to an alkali-soluble state. Accordingly, by conducting wet developing using an alkali developing solution, the exposed portions are dissolved in the developing solution, thereby forming the first resist pattern 4'. As shown in FIG. 1C, the first resist pattern 4' is formed as a line and space pattern (hereafter abbreviated as "L/pattern") having a line width of d/2, a space width of 3d/2, and a pitch of 2d.

There are no particular limitations on the bake treatment mentioned above, and heating may be conducted, for example, at a temperature of not less than 70° C. and not more than 130° C. for a period of 40 to 180 seconds, and preferably for a period of 60 to 90 seconds.

Subsequently, the hard mask 3 is etched using the first resist pattern 4' as a mask, thereby forming the first pattern. In other words, the first resist pattern 4' is transferred to the hard mask 3.

The etching can be performed using conventional methods. For example, the etching can be performed by irradiation with a plasma and/or reactive ions. The etching conditions may be selected appropriately in accordance with factors such as the type of gas used.

There are no particular limitations on the plasma and/or reactive ion gas used for etching, and any of the gases typically used in the field of dry etching may be used. Examples thereof include oxygen, halogens, and sulfur dioxide, although the use of a plasma and/or reactive ion that contains halogens, such as $CF_4$ or $CHF_3$ is preferable.

There are no particular limitations on the etching method, and examples of methods that may be used include chemical etching methods such as down-flow etching or chemical dry etching; physical etching methods such as sputter etching or ion beam etching; and chemical-physical etching methods such as RIE (reactive ion etching).

The most typical type of dry etching is parallel plate RIE. In this method, first, a laminate having a resist pattern formed thereon is placed inside the RIE apparatus chamber, and the required etching gas is introduced. A high frequency voltage is then applied within the chamber, between an upper electrode and the resist laminate holder which is positioned parallel to the electrode, and this causes the generation of a gas plasma. The plasma contains various etching seeds, including charged particles such as positive and negative ions and electrons, as well as electrically neutral active seeds. When these etching seeds adsorb to the lower organic layer, a chemical reaction occurs, and the resulting reaction product breaks away from the surface and is discharged externally, causing the etching to proceed.

Figure 1D:
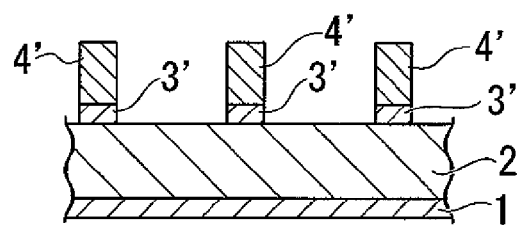
FIG. 1D is as described for FIG. 1A.
Figure 1E:
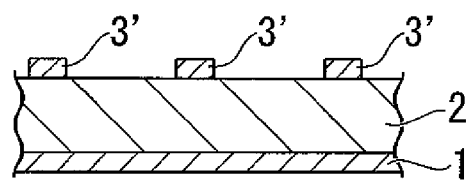
FIG. 1E is as described for FIG. 1A.

Following etching of the hard mask 3, either the first resist pattern 4' may be removed as shown in FIG. 1E, so that the hard mask pattern 3' on the underlayer film 2 functions as the first pattern, or alternatively as shown in FIG. 1D, the first resist pattern 4' may be left intact, so that the first resist pattern 4' and the hard mask pattern 3' function as the first pattern.

<Patterning Process (2)>

Following the patterning process (1) described above, a second pattern is formed. FIG. 2A to FIG. 2D are schematic process diagrams illustrating the patterning process (2) of a preferred embodiment of a method of forming a pattern according to the present invention. FIG. 2A to FIG. 2D shows the case where the first resist pattern 4' has been removed and the hard mask pattern 3' functions as the first pattern, but even in the case where the first resist pattern 4' is left intact and functions as the first pattern, the same procedure as that described below can be used to form the second pattern. As the method for removing the first resist pattern, conventional techniques that use a stripping liquid or the like may be used to strip off the first pattern.

Figure 2A:
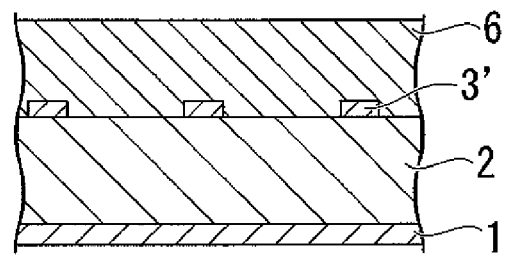
FIG. 2A is a schematic process diagram illustrating a patterning process (2) of a preferred embodiment of a method of forming a pattern according to the present invention.

As shown in FIG. 2A, a chemically amplified positive silicon-based resist composition is applied to the first pattern and the underlayer film 2 formed in the manner described above, thereby forming a second resist film 6. In a similar manner to the first resist film 4, the second resist film 6 may be formed using conventional methods.

The thickness of the second resist film 6 may be selected appropriately so as to achieve a balance between the desired aspect ratio and the throughput, with due consideration of the time taken for dry etching of the underlayer film 2, and is preferably not less than 100 nm and not more than 200 nm. By ensuring that the thickness of the second resist film 6 is not more than 200 nm, a resist pattern can be formed at a high resolution, whereas ensuring a thickness of not less than 100 nm yields effects such as a satisfactory resistance to dry etching.

The silicon content within the chemically amplified positive silicon-based resist composition is preferably at least 10%, and more preferably 20% or higher, as such values enable favorable formation of a pattern having a high aspect ratio.

Figure 2B:
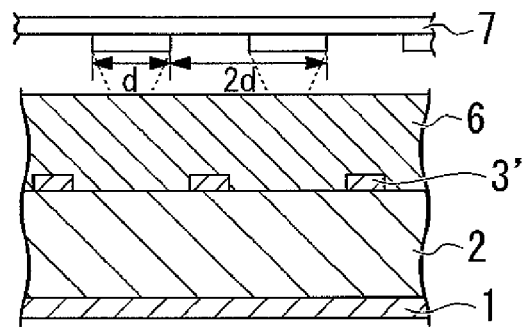
FIG. 2B is as described for FIG. 2A.

Subsequently, as shown in FIG. 2B, the second resist film 6 is selectively exposed through a second mask pattern 7 and then developed to form a second resist pattern 6'. As was the case for formation of the first resist pattern 4', the selective exposure and developing may be conducted using conventional methods. In a similar manner to that described for the first mask pattern 5, the second mask pattern 7 used in this step may be selected appropriately in accordance with the pattern that is required. The figure shows an example in which a similar pattern to the first resist pattern 4' is formed as the second resist pattern 6', and in the same manner as the first mask pattern 5, the second mask pattern 7 has a space width of (d) and a pitch of (2d). In other words, in this specific example, the first mask pattern 5 is used as the second mask pattern 7 during formation of the second resist pattern 6', and the second resist film 6 is selectively exposed with the mask pattern positioned in a different location from that used for the selective exposure of the first resist film 4.

Figure 2C:
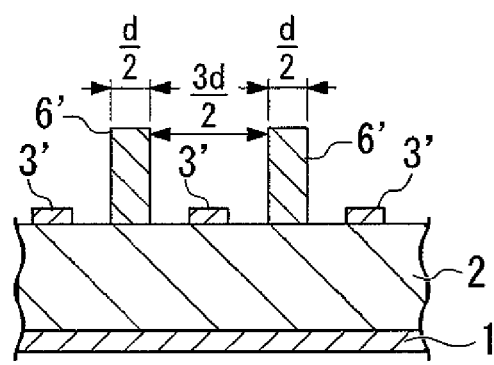
FIG. 2C is as described for FIG. 2A.

If a resist composition such as that described above is used as the chemically amplified positive silicon-based resist composition, then acid is generated within the exposed portions by the selective exposure, and the action of that acid causes the resin within the exposed portions to become alkali-soluble. Accordingly, by conducting wet developing using an alkali developing solution, the exposed portions are dissolved in the developing solution, thereby forming the second resist pattern 6'. As shown in FIG. 2C, the second resist pattern 6' is formed as an L/S pattern having a line width of d/2, a space width of 3d/2, and a pitch of 2d. Moreover, the L/S pattern is offset relative to the hard mask pattern 3' that functions as the first pattern by a space width of d/2.

Figure 2D:
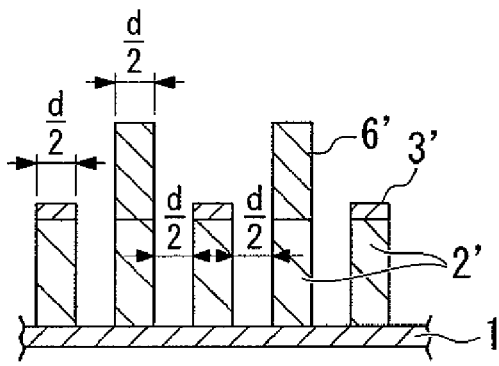
FIG. 2D is as described for FIG. 2A.

Subsequently, as shown in FIG. 2D, the underlayer film 2 is etched using the first pattern 3' and the second resist pattern 6' as a mask, thereby transferring the first pattern 3' and the second resist pattern 6' onto the underlayer film 2. The thus obtained underlayer film pattern 2' functions as the second pattern. In the same manner as that described for the etching method for the hard mask 3, etching of the underlayer film 2 can be conducted using conventional methods. There are no particular limitations on the plasma and/or reactive ion gas used for the etching, and oxygen, halogens and sulfur dioxide and the like may be exemplified. The use of a plasma and/or reactive ion gas containing oxygen is preferred, not only because such gases are widely used, but also because the resulting pattern exhibits a high level of resolution.

The second pattern is an L/S pattern having a line width of d/2, a space width of d/2, and a pitch of d. If, for example, the value of d is 180 nm, then the present invention enables the formation of a very fine pattern having a line width of 90 nm and a space width of 90 nm. In the obtained second pattern, the line width and the space width may vary slightly depending on the conditions within each of the steps.

In this manner, a pattern formed on a substrate in accordance with the present invention has a high aspect ratio, suffers no pattern collapse, and exhibits a favorable shape with a high degree of verticalness. In contrast, a conventional pattern obtained using a single layer resist patterning process is unable to provide this level of superior fineness, nor this type of high aspect ratio. Further, even with conventionally proposed double patterning methods, the pattern precision is poor, and pattern collapse and regions of poor verticalness tend to occur within the pattern, meaning a very fine pattern is unobtainable.

EXAMPLES

The present invention is described in further detail below using a series of specific examples, although the present invention is in no way limited by the examples presented below.

<Preparation of Hard Mask-forming Material>

A siloxane-based copolymer represented by chemical formula (1) shown below was synthesized in accordance with the synthesis method disclosed in International Patent Publication (WO) 2006/065321 pamphlet. Namely, a mixture containing 120 g of PGMEA, 5.29 g (0.025 mols) of phenyltrichlorosilane, 6.77 g (0.050 mols) of trichlorosilane, 22.43 g (0.150 mols) of methyltrichlorosilane and 5.54 g (0.025 mols) of 2-carbomethoxyethyltrichlorosilane was placed in a reaction vessel under an atmosphere of nitrogen. A solution of 200 g of PGMEA and 10 g (0.555 mols) of water was added to the solution of trichlorosilanes over a period of at least one hour. The reaction was then allowed to proceed at 20° C. under stirring for one hour. Subsequently, a rotary evaporator at 40° C. was used to concentrate the resin solution to approximately 10 wt % Approximately 40 g of ethanol was then added to the resin solution. The solution was then stripped once more to obtain a concentration of 20 wt %. The flask was removed again, and the solution was diluted to 10 wt % by adding PGMEA. The solution was then filtered through a 0.20 micron PTFE filter. 100 parts by weight of the siloxane-based copolymer synthesized in this manner, which is represented by chemical formula (1) shown below and has a weight average molecular weight (Mw) of 24,000 and a dispersity (Mw/Mn) of 3.17, together with 7 parts by weight of an acid generator represented by chemical formula (2) shown below, and 3 parts by weight of hexadecyltrimethylammonium chloride were dissolved in a sufficient quantity of a mixed solvent of PGMEA/EL=6/4 (weight ratio) to generate a solid fraction concentration of 2% by weight, thus forming a hard mask-forming material.

[Chemical Formula 33]

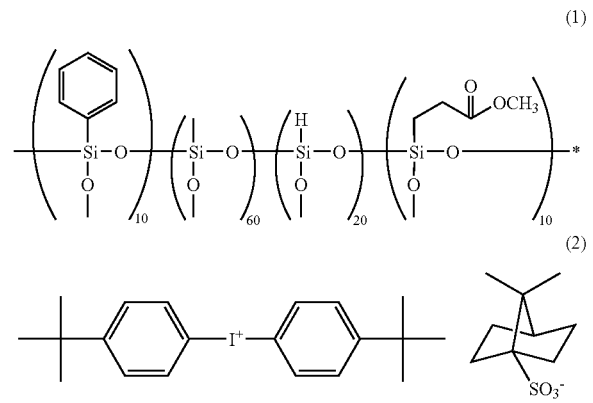

(1)

(2)

<Preparation of Chemically Amplified Positive Resist Composition>

50 parts by weight of a copolymer represented by chemical formula (A)-1 shown below and having a weight average molecular weight of 10,000 and a dispersity of 2.0, 50 parts by weight of a copolymer represented by chemical formula (A)-2 shown below and having a weight average molecular weight of 10,000 and a dispersity of 2.0, 7.0 parts by weight of di(1-naphthyl)phenylsulfonium nonafluorobutanesulfonate, 1.0 parts by weight of (4-methylphenyl)diphenylsulfonium nonafluorobutanesulfonate, 1.2 parts by weight of tri-n-octylamine, and 0.5 parts by weight of salicylic acid were dissolved in 1,550 parts by weight of a mixed solvent of PGMEA/PGME=6/4 (weight ratio), yielding a positive resist composition.

[Chemical Formula 34]

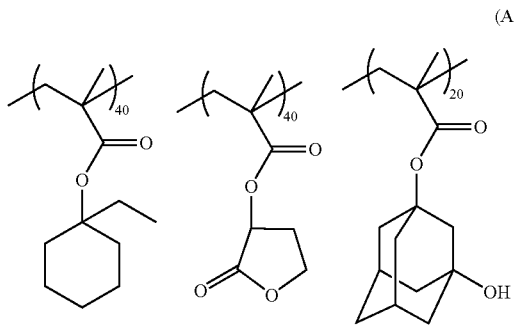

(A)-1

[Chemical Formula 35]

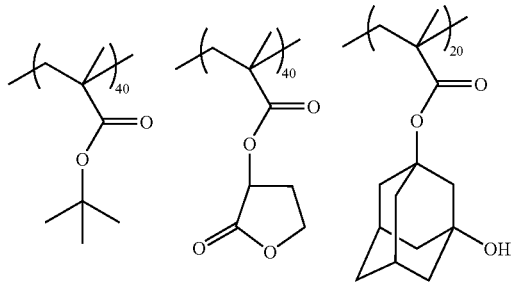

(A)-2

<Preparation of Chemically Amplified Positive Silicon-based Resist Composition>

(Preparation of Hydrogenated Silsesquioxane Resin)

100 g of a toluenesulfonic acid monohydrate (TSAM) solution prepared by sulfonating toluene using concentrated $H_2SO_4$ and $SO_3$ gas was placed in a 500 ml flask fitted with a condenser, a thermometer, a magnetic stirrer and a nitrogen bubbler. A solution prepared by dissolving trichlorosilane (10 g, 0.075 mols) in 50 g of toluene was then gradually added dropwise to the flask with vigorous stirring, yielding a mixture. The resulting mixture was washed at least 3 times with deionized water, and the organic phase was then extracted. The solvent was removed from the extracted organic phase by evaporation under reduced pressure using a rotary evaporator, yielding a solution of a hydrogenated silsesquioxane resin (HSQ) with a solid fraction concentration within a range from 5 to 25% by weight.

(Introduction of Acid-decomposable Group)

An olefin solution was prepared by mixing together approximately 0.1 mols of bicyclo[2,2,1]hept-5-ene-2-t-butylcarboxylate and anhydrous toluene (50:50). To the thus obtained olefin solution was added 200 ppm of a 1,3-diethenyl-1,1,3,3-tetramethyldisiloxane complex (platinum, concentrated). Subsequently, the olefin solution was transferred to a flask fitted with a condenser, a thermometer, a magnetic stirrer and a nitrogen bubbler, and the flask was purged with nitrogen. Following nitrogen purging, the HSQ solution prepared above was added gradually to the olefin solution. Following completion of the addition, the system was stirred gently under reflux for 8 hours. The reaction (hydrosilylation reaction) within the system was monitored using $^1$H-NMR, and the reaction was halted once the olefin peak had completely disappeared. As a result, a siloxane-based copolymer was obtained in which the acid-decomposable group represented by formula (I)-1 shown below had been introduced into the HSQ. The weight average molecular weight of the siloxane-based copolymer determined by gel permeation chromatography (GPC) and referenced against polystyrene standards was 6,300, and the dispersity was 2.1. Further, in the siloxane-based copolymer, the compositional ratio between HSQ, and the structural unit in which the acid-decomposable group represented by formula (I)-1 shown below had been introduced into the HSQ was 57:43 (molar ratio).

[Chemical Formula 36]

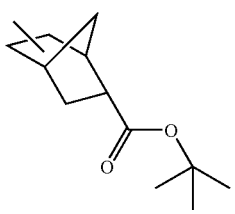
(I)-1

By substituting the solvent of the thus obtained resin solution with a mixed solvent of PGMEA/PGME=8/2 (weight ratio), a PGMEA/PGME solution of the above siloxane-based copolymer having a solid fraction concentration of 5% by weight was obtained.

The PGMEA/PGME solution of the above siloxane-based copolymer (containing a solid fraction equivalent to 100 parts by weight of the siloxane-based copolymer) was mixed with a component (B), a compound (C), a component (D), a component (E) and a component (F) shown below in Table 1, using the quantities shown in Table 1, and also with a quantity of γ-butyrolactone shown below in Table 1, and the mixture was dissolved to form a resist composition.

TABLE 1

| Component (A) | Siloxane-based copolymer |
| --- | --- |
| | [100] |
| Component (B) | (B)-1 |
| | [6.0] |
| | (B)-2 |
| | [2.0] |
| Compound (C) | (C)-1 |
| | [7.0] |
| Component (D) | (D)-1 |
| | [0.2] |
| Component (E) | (E)-1 |
| | [1.5] |
| Component (F) | (F)-1 |
| | [0.84] |
| γ-butyrolactone | [20] |

In Table 1, the numerical values inside the brackets [ ] represent blend quantities (parts by weight). The abbreviations have the meanings shown below.

(B)-1: a compound represented by formula (B)-1 shown below.

(B)-2: a compound represented by formula (B)-2 shown below.

(C)-1: a compound represented by formula (C)-1 shown below.

(D)-1: a compound represented by formula (D)-1 shown below.

(E)-1: a compound represented by formula (E)-1 shown below.

(F)-1: malonic acid

[Chemical Formula 37]

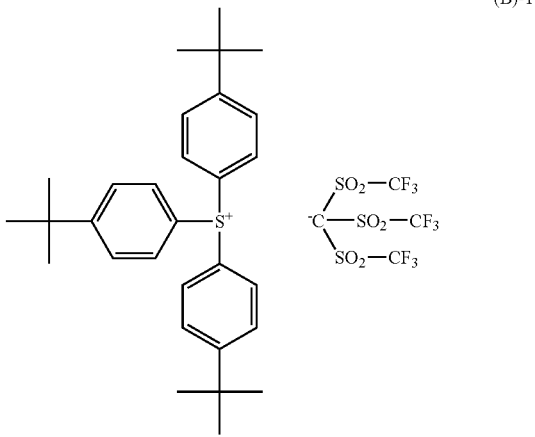
(B)-1

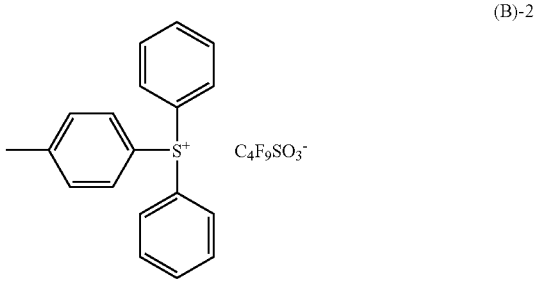
(B)-2

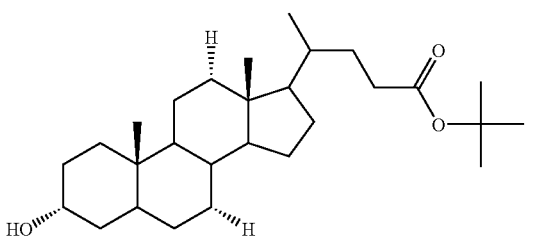
(C)-1

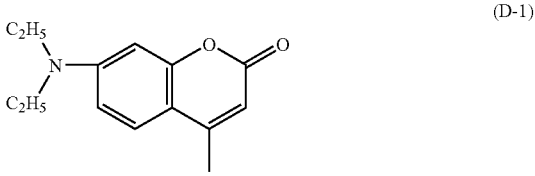
(D-1)

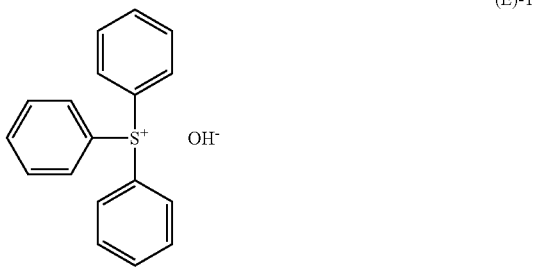
(E)-1

<Pattern Formation>

Using the procedure described below, a pattern was formed using the same steps as those shown in FIG. 1A to FIG. 1E and FIG. 2A to FIG. 2D.

BLC730 (a product name, manufactured by Tokyo Ohka Kogyo Co., Ltd.) was applied as an underlayer film-forming material to the surface of an 8-inch silicon wafer, and the material was subjected to a bake treatment at 250° C. for 90 seconds, thus forming an underlayer film with a film thickness of 250 nm.

The hard mask-forming material described above was then applied to the underlayer film and baked at 250° C. for 90 seconds, forming a hard mask with a film thickness of 45 nm.

Subsequently, the positive resist composition described above was spin coated onto the hard mask and then prebaked (PAB) at 115° C. for 60 seconds, thus forming a first resist film with a film thickness of 150 nm.

This first resist film was then selectively exposed through a mask using an ArF excimer laser exposure apparatus NSR-S302 (manufactured by Nikon Corporation, NA=0.6, σ=0.75).

Subsequently, a post exposure bake (PEB) was conducted at 115° C. for 60 seconds, and the resist film was then developed for 30 seconds at 23° C. using a 2.38% by weight aqueous solution of tetramethylammonium hydroxide. A rinse treatment with pure water was then conducted for 30 seconds, thus forming a first resist pattern.

Using the first resist pattern as a mask, the hard mask was subjected to an etching treatment using an etching apparatus TCE-7811 (a product name, manufactured by Tokyo Ohka Kogyo Co., Ltd.), under conditions including a table temperature of 25/20° C., an etching gas of $CF_4/CHF_3/He$ (sccm)=40/20/160, an output of 300 W, a pressure of 300 mTorr, and an etching time of 26 seconds. As a result, the first resist pattern was transferred to the hard mask, thus forming a first pattern. Inspection of the cross-sectional shape of this L/S pattern using a SEM (scanning electron microscope) revealed a line width of 90 nm and a space width of 270 nm. Next, the substrate was dipped in a stripping liquid composed of tetramethylammonium hydroxide (TMAH)/dimethylsulfoxide (DMSO)/water=10/50/40 (weight ratio) at 40° C. for 6 minutes, thus stripping off the resist film.

The chemically amplified positive silicon-based resist composition described above was spin coated onto the first pattern, and a prebake (PAB) was conducted at 85° C. for 60 seconds, thereby forming a second resist film with a film thickness of 130 nm.

Subsequently, the above-mentioned mask was displaced 90 nm from the position used during exposure of the first resist film, and the second resist film was then selectively exposed through the mask using an ArF excimer laser exposure apparatus NSR-S302 (manufactured by Nikon Corporation, NA=0.6, σ=0.75).

A post exposure bake (PEB) was then conducted at 95° C. for 60 seconds, and the second resist film was then developed for 30 seconds at 23° C. using a 2.38% by weight aqueous solution of tetramethylammonium hydroxide. A rinse treatment with pure water was then conducted for 30 seconds, thus forming a second resist pattern. Subsequently, using the first pattern and the second resist pattern as a mask, the underlayer film was subjected to an etching treatment using an etching apparatus GP-12 (a product name, manufactured by Tokyo Ohka Kogyo Co., Ltd.), under conditions including a table temperature of 25/20° C., an etching gas of $O_2/N_2$ (sccm)=60/40, an output of 1,600 W with a bias of 70 W, a pressure of 3 mTorr, and an etching time of 4 minutes, thereby forming a second pattern. The cross-sectional shape of this L/S pattern was inspected using a SEM (scanning electron microscope). The inspection revealed a line width of 95 nm in those regions masked by the hard mask and a line width of 85 nm in those regions masked by the second resist film, and a space width of 95 nm. On the other hand, calculation of the aspect ratio revealed a value of approximately 3.4, confirming that a pattern having a high aspect ratio had been formed.

INDUSTRIAL APPLICABILTY

The present invention is able to provide a method of forming a pattern that enables a very fine pattern having a high aspect ratio to be formed on a support, and is therefore extremely useful industrially.

The invention claimed is:

1. A method of forming a pattern using a chemically amplified resist composition, said method comprising:
forming an underlayer film on a support using an underlayer film-forming material, forming a hard mask on said underlayer film using a silicon-based hard mask-forming material, forming a first resist film by applying a chemically amplified positive resist composition to said hard mask, forming a first resist pattern by selectively exposing said first resist film through a first mask pattern and then performing developing, forming a first pattern by etching said hard mask using said first resist pattern as a mask,
forming a second resist film by applying a chemically amplified positive silicon-based resist composition to said first pattern and said underlayer film, forming a second resist pattern by selectively exposing said second resist film through a second mask pattern and then performing developing, and forming a second pattern by etching said underlayer film using said first pattern which is formed by etching said hard mask using said first resist pattern as a mask and said second resist pattern as a mask.

2. A pattern-forming method according to claim 1, wherein said chemically amplified positive silicon-based resist composition comprises a resin component (A) that exhibits increased alkali solubility under action of acid and an acid generator component (B) that generates acid upon exposure, and said resin component (A) comprises a resin (A1) containing a structural unit (a1) represented by general formula (a1) shown below and a structural unit (a2) represented by general formula (a2) shown below:

wherein $R^1$ is an acid-decomposable group represented by general formula (I) shown below:

wherein $R^2$ and $R^3$ each independently represents a linking group; L represents a group selected from the group consisting of linear or branched alkylene groups of 1 to 10 carbon atoms, linear or branched fluoroalkylene groups of 2 to 20 carbon atoms, substituted or unsubstituted arylene groups, substituted or unsubstituted cyclic alkylene groups, and substituted or unsubstituted alkarylene groups; Z represents an acid-dissociable group; g represents 0 or 1; and h represents 0 or 1.

3. A pattern-forming method according to claim 1 or claim 2, wherein said first mask pattern is used as said second mask pattern, and said second resist film is selectively exposed with said first mask pattern provided in a different location from that used for selective exposure of said first resist film.

* * * * *

UNITED STATES PATENT AND TRADEMARK OFFICE
CERTIFICATE OF CORRECTION

PATENT NO. : 8,178,284 B2
APPLICATION NO. : 12/440711
DATED : May 15, 2012
INVENTOR(S) : Shinichi Kohno et al.

It is certified that error appears in the above-identified patent and that said Letters Patent is hereby corrected as shown below:

At Column 14, Lines 11-15 (Approx.),

Change " 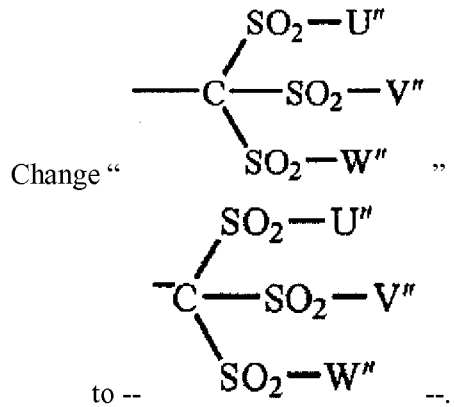 ",

At Column 21, Line 6, Change "(b-T)" to --(b-1)--.

At Column 22, Line 45, Change "$R^{11"}$" to --$R^{11}$--.

At Column 22, Line 63, Change ""(meth)ac late" to --"(meth)acrylate--.

At Column 38, Line 5, Change "T-" to --1- --.

At Column 38, Line 53, Change "thereof," to --thereof;--.

At Column 38, Line 64, Change "thereof," to --thereof;--.

At Column 39, Line 14, Change "1-ketosulfone" to --β-ketosulfone--.

At Column 40, Lines 59-60, Change "dicarboxylmide" to --dicarboxyimide--.

At Column 40, Line 61, Change "dicarboxylmide" to --dicarboxyimide--.

At Column 40, Line 62, Change "dicarboxylmide" to --dicarboxyimide--.

Signed and Sealed this
Nineteenth Day of March, 2013

Teresa Stanek Rea
*Acting Director of the United States Patent and Trademark Office*

CERTIFICATE OF CORRECTION (continued)
U.S. Pat. No. 8,178,284 B2

At Column 44, Line 5, Change "The" to --There--.

At Column 44, Line 35, Change ""L/pattern")" to --"L/S pattern")--.

At Column 46, Line 67, After "10 wt %" insert --.--.

At Column 50, Line 3, After "acid" insert --.--.

At Column 50, Line 45 (Approx.), Change "(D-1)" to --(D)-1--.